United States Patent
Rashid et al.

(10) Patent No.: US 9,104,823 B2
(45) Date of Patent: *Aug. 11, 2015

(54) OPTIMIZATION WITH A CONTROL MECHANISM USING A MIXED-INTEGER NONLINEAR FORMULATION

(71) Applicant: SCHLUMBERGER TECHNOLOGY CORPORATION, Sugar Land, TX (US)

(72) Inventors: Kashif Rashid, Wayland, MD (US); Sulyman Demirel, Ann Arbor, MI (US); Benoit Couet, Belmont, MA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/174,643

(22) Filed: Feb. 6, 2014

(65) Prior Publication Data

US 2014/0156238 A1 Jun. 5, 2014

Related U.S. Application Data

(63) Continuation of application No. 13/253,680, filed on Oct. 5, 2011.

(60) Provisional application No. 61/392,530, filed on Oct. 13, 2010.

(51) Int. Cl.
*G05B 11/01* (2006.01)
*G05B 13/02* (2006.01)
(Continued)

(52) U.S. Cl.
CPC ............ *G06F 17/5009* (2013.01); *E21B 43/00* (2013.01); *E21B 43/12* (2013.01);
(Continued)

(58) Field of Classification Search
CPC ........ G05B 15/00; G05B 13/04; G05B 17/00; E21B 43/12; E21B 43/14; E21B 44/00; E21B 2041/0028; E21B 41/0035; E21B 41/0092; E21B 43/122

USPC ............... 700/19, 28–29, 32, 301; 703/9–10; 166/52–53, 250.15, 366, 368
See application file for complete search history.

(56) References Cited

U.S. PATENT DOCUMENTS 6,236,894 B1 * 5/2001 Stoisits et al. .................. 700/28
6,343,656 B1 * 2/2002 Vazquez et al. ............... 166/373
(Continued)

FOREIGN PATENT DOCUMENTS

WO        0165068 A1     9/2001

OTHER PUBLICATIONS

Kanu, E.R, Mach, J., and Brown, K.E., "Economic Approach to Oil Production and Gas Allocation in Continuous Gas Lift," Journal of Petroleum Technology, Oct. 1981, vol. 33, No. 10, pp. 1887-1892.
(Continued)

*Primary Examiner* — Ronald Hartman, Jr.
(74) *Attorney, Agent, or Firm* — Alec J. McGinn

(57) ABSTRACT

A method of optimizing production of wells using choke control includes generating, for each well, an intermediate solution to optimize the production of each well. The generating includes using an offline model that includes a mixed-integer nonlinear program solver and includes using production curves based on a choke state and a given wellhead pressure. The method further includes calculating, using a network model and the intermediate solution of each well, a current online wellhead pressure for each well. The method further includes setting the intermediate solution as a final solution based on determining that a difference between the current online wellhead pressure of each well and a prior online wellhead pressure of each well is less than a tolerance amount. The method further includes adjusting, using the final solution of each well, at least one operating parameter of the wells.

20 Claims, 10 Drawing Sheets

(51) Int. Cl.
| | |
|---|---|
| G05D 16/00 | (2006.01) |
| G06G 7/48 | (2006.01) |
| G06G 7/50 | (2006.01) |
| E21B 43/12 | (2006.01) |
| E21B 7/12 | (2006.01) |
| E21B 29/12 | (2006.01) |
| E21B 34/04 | (2006.01) |
| E21B 41/04 | (2006.01) |
| E21B 43/01 | (2006.01) |
| E21B 43/36 | (2006.01) |
| G06F 17/50 | (2006.01) |
| E21B 43/00 | (2006.01) |
| E21B 41/00 | (2006.01) |
| E21B 43/14 | (2006.01) |
| E21B 44/00 | (2006.01) |
| G05B 13/04 | (2006.01) |
| G05B 15/00 | (2006.01) |
| G05B 17/00 | (2006.01) |

(52) U.S. Cl.
CPC .......... *E21B 43/122* (2013.01); *E21B 41/0035* (2013.01); *E21B 41/0092* (2013.01); *E21B 43/14* (2013.01); *E21B 44/00* (2013.01); *E21B 2041/0028* (2013.01); *G05B 13/04* (2013.01); *G05B 15/00* (2013.01); *G05B 17/00* (2013.01)

(56) References Cited

U.S. PATENT DOCUMENTS

| | | | | |
|---|---|---|---|---|
| 6,595,294 | B1* | 7/2003 | Dalsmo et al. | 166/369 |
| 6,729,395 | B2* | 5/2004 | Shahin et al. | 166/245 |
| 6,807,501 | B1 | 10/2004 | Hyde | |
| 7,434,619 | B2 | 10/2008 | Rossi et al. | |
| 7,474,969 | B2 | 1/2009 | Poulisse | |
| 7,516,056 | B2 | 4/2009 | Wallis et al. | |
| 7,627,461 | B2 | 12/2009 | Guyaguler et al. | |
| 7,640,149 | B2* | 12/2009 | Rowan et al. | 703/10 |
| 7,672,825 | B2* | 3/2010 | Brouwer et al. | 703/10 |
| 7,684,967 | B2 | 3/2010 | Wallis et al. | |
| 7,797,139 | B2* | 9/2010 | Guthrie et al. | 703/2 |
| 7,953,584 | B2* | 5/2011 | Rashid | 703/10 |
| 8,078,328 | B2* | 12/2011 | Malki et al. | 700/282 |
| 8,078,444 | B2* | 12/2011 | Rashid et al. | 703/10 |
| 8,321,190 | B2* | 11/2012 | Hansen et al. | 703/10 |
| 8,380,475 | B2 | 2/2013 | Slupphaug et al. | |
| 8,600,717 | B2* | 12/2013 | Rashid et al. | 703/10 |
| 8,670,966 | B2* | 3/2014 | Rashid et al. | 703/10 |
| 8,688,426 | B2* | 4/2014 | Al-Shammari | 703/10 |
| 8,849,623 | B2* | 9/2014 | Carvallo et al. | 703/2 |
| 2003/0110017 | A1* | 6/2003 | Guthrie et al. | 703/2 |
| 2006/0265204 | A1 | 11/2006 | Wallis et al. | |
| 2007/0010979 | A1 | 1/2007 | Wallis et al. | |
| 2007/0175640 | A1 | 8/2007 | Atencio et al. | |
| 2008/0103743 | A1 | 5/2008 | Howell et al. | |
| 2008/0133194 | A1 | 6/2008 | Klumpen et al. | |
| 2008/0140369 | A1 | 6/2008 | Rashid et al. | |
| 2008/0154564 | A1* | 6/2008 | Rashid | 703/10 |
| 2008/0319726 | A1 | 12/2008 | Berge et al. | |
| 2009/0166033 | A1* | 7/2009 | Brouwer et al. | 166/250.02 |
| 2009/0198477 | A1 | 8/2009 | Benish et al. | |
| 2009/0254325 | A1* | 10/2009 | Gokdemir et al. | 703/10 |
| 2010/0036537 | A1 | 2/2010 | Bieker et al. | |
| 2010/0042458 | A1* | 2/2010 | Rashid et al. | 705/8 |
| 2010/0094605 | A1 | 4/2010 | Hajibeygi et al. | |
| 2011/0022363 | A1* | 1/2011 | Furman et al. | 703/1 |
| 2011/0119037 | A1 | 5/2011 | Rashid et al. | |
| 2011/0320047 | A1* | 12/2011 | Stone et al. | 700/282 |
| 2014/0180658 | A1* | 6/2014 | Rossi et al. | 703/10 |

OTHER PUBLICATIONS

Clegg, J.D., "Discussion of Economic Approach to Oil Production and Gas Allocation in Continuous Gas Lift," SPE 10858, Feb. 1982, Journal of Petroleum Technology, pp. 301-302.

Kanu, E.P., "Author's Reply to Discussion of Economic Approach to Oil Production and Gas Allocation in Continuous Gas Lift," SPE 10865, Mar. 1982, Journal of Petroleum Technology, Mar. 1982, p. 519.

Brown, Kermit E., "Overview of Artificial Lift Systems," Journal of Petroleum Technology, Oct. 1982, vol. 34, No. 10, pp. 2384-2396.

Martinez, E.R., Moreno, W.J., Moreno, J.A., and Maggiolo, R., "Application of Genetic Algorithm on the Distribution of Gas-Lift Injection," SPE 26993, Presented at the III Latin American/Caribbean Petroleum Engineering Conference held in Buenos Aires, Argentina, Apr. 27-29, 1994.

Fujii, H., and Horne, R., "Multivariate Optimization of Networked Production Systems," SPE Production & Facilities, Aug. 1995, pp. 165-171.

Fang, W.Y., and Lo, K.K., "A Generalized Well-Management Scheme for Reservoir Simulation," SPE Reservoir Engineering, May 1996, pp. 116-120.

Dutta-Roy, K., and Kattapuram, J., "A New Approach to Gas-Lift Allocation Optimization," SPE 38333, Presented at the 1997 SPE Western Regional Meeting held in Long Beach, California, USA, Jun. 25-27, 1997, pp. 685-691.

Stoisits, R.F., Crawford, K.D., MacAllister, D.J., McCormack, M.D., Lawal, A.S., and Ogbe, D.O., "Production Optimization at the Kuparuk River Field Utilizing Neural Networks and Genetic Algorithms," SPE 52177, Presented at the 1999 Mid-Continent Operations Symposium held in Oklahoma City, Oklahoma, USA, Mar. 28-31, 1999.

Fletcher, R., "Practical Methods of Optimization," 2000, pp. 213-218, John Wiley and Sons, New York, NY, USA.

Vazquez, M., Suarez, A., Aponte, H., Ocanto, L., and Fernandes, J., "Global Optimization of Oil Production Systems, A Unified Operational View," SPE 71561, Presented at the 2001 SPE Annual Technical Conference held in New Orleans, LA, USA, Sep. 30-Oct. 3, 2001, 9 pages.

Press, W.H., Teukolsky, S.A., Vetterling, W.T., Flannery, B.P., "Numerical Recipes in C++," 2002, 3rd Edition, pp. 413-417, Cambridge University Press.

Kosmidis, V.D., Perkins, J.D., and Pistikopoulos E.N., "Optimization of Well Oil Rate Allocations in Petroleum Fields," 2004, Industrial & Engineering Chemical Research, vol. 42, pp. 3513-3527.

Barragan-Hernandez, V., Vazquez-Roman, R., Rosales-Marines, L., Garcia-Sanchez, F., "A Strategy for Simulation and Optimization of Gas and Oil Production," Oct. 6, 2005, Computers & Chemical Engineering, vol. 30, Issue 2, pp. 215-227.

Beggs, H.D., "Production Optimization Using Nodal Analysis," 2006, 2nd Edition, pp. 2-7, OGCI International, Oklahoma, USA.

Beggs, H.D., "Production Optimization Using Nodal Analysis," 2006, 2nd Edition, pp. 155-161, OGCI International, Oklahoma, USA.

Ray, T., and Sarker, R., "Multiobjective Evolutionary Approach to the Solution of Gas Lift Optimization Problems," Presented at 2006 IEEE Congress on Evolutionary Computation held in Vancouver, British Columbia, Canada, Jul. 16-21, 2006, , pp. 3182-3188.

Rashid, K., "A Method for Optimal Lift-Gas Allocation and other Production Scenarios," Research Note, Sep. 23, 2006, Schlumberger Abingdon Technology Centre (AbTC), Abingdon, UK, 32 pages.

Nadar, M.S., Schneider, T.S., Jackson, K.L., McKie, C.J.N., and Hamid, J., "Implementation of a Total System Production Optimization Model in a Complex Gas-Lifted Offshore Operation," SPE 103670, Presented at the 2006 SPE Annual Technical Conference and Exhibition held in San Antonio, TX, USA, Sep. 24-27, 2006, 12 pages.

Bonami, P., Biegler, L.T., Conn, A.R., Cornuejols, G., Grossmann, I.E., Laird, C.D., Lee, J., Lodi, A., Margot, F., Sawaya, N., and

(56) References Cited

OTHER PUBLICATIONS

Wachter, A., "An Algorithmic Framework for Convex Mixed integer Nonlinear Programs," Discrete Optimization, May, 2008, vol. 5, Issue 2, pp. 1-22.

Misener, R., Gounaris, C.E., and Floudas, C.A., "Global Optimization of Gas Lifting Operations: A Comparative Study of Piecewise Linear Formulations," 2009, Industrial & Engineering Chemical Research, vol. 48, pp. 6098-6104.

Couet, B., Tonkin, T., and Wilkinson, D., "Production Enhancement Through Integrated Asset Modeling Optimization," SPE 135901, Presented at the SPE Production and Operations Conference held in Tunis, Tunisia, Jun. 8-10, 2010.

Rashid, K., Bailey, W., and Couet, B., "A Survey of Methods for Gas Lift Optimization," M&S: Schlumberger Journal of Modeling, Design, and Simulation, Jun. 2011, vol. 2, pp. 1-13.

Bonami, et al., "An algorithmic framework for convex mixed integer nonlinear programs", Discrete Optimization, 5 (2), 2008, pp. 186-204.

Buitrago, et al., "Global optimization techniques in gas allocation for continuous flow gas-lift systems", SPE 35616 SPE Gas Technology Symposium, 1996, 9 pages.

Fubin, et al., "Simulated Annealing for the 0/1 Multidimensional Knapsack Problem", Numer. Math., J. Chin. Univ., 16, No. 4, 2007, pp. 320-327.

Gutierrez, et al., "An Integrated, Innovative Solution to Optimize Hydrocarbon Production Through the Use of a Workflow Oriented Approach", SPE Gulf Coast Section 2008 Digital Energy Conference and Exhibition, Society of Petroleum Engineers, May 20-21, 2008, 10 pages.

Kosmidis, et al., "A Mixed Integer Optimization Formulation for the Well Scheduling Problem on Petroleum Fields", Computers and Chemical Engineering 29, Elsevier Ltd., Jan. 20, 2005, pp. 1523-1541.

Ortiz-Gomez, et al., "Mixed-Integer Multiperiod Model for Planning of Oilfield Production", Computers and Chemical Engineering 26, Elsevier Science Ltd., 2002, pp. 703-714.

Rashid, Kashif, "Optimal Allocation Procedure for Gas-Lift Optimization", Ind. Eng. Chem. Res., vol. 49 (5), 2010, pp. 2286-2294.

Van Den Heever, et al., "A Mixed-Integer Nonlinear Programming Approach to the Optimal Planning of Offshore Oilfield Infrastructures", Carnegie Mellon University, Aug. 2, 2006, 26 pages.

Van Den Heever, et al., "An Iterative Aggregation/Disaggregation Approach for the Solution of a Mixed-Integer Nonlinear Oilfield Infrastructure Planning Model", Ind. Eng. Chem. Res., vol. 39, 2000, pp. 1955-1971.

Wang, et al., "Development and Applications of Production Optimization Techniques for Petroleum Fields", Department of Petroleum Engineering, Stanford University, Mar. 2003, 196 pages.

Young, et al., "Information-Guided Algorithm Approach to the Solution of MINLP Problems", Ind. Eng. Chem. Res., vol. 46, American Chemical Society, Feb. 8, 2007, pp. 1527-1537.

International Search Report and Written Opinion for Application No. PCT/US2011/055794, dated May 21, 2012.

Rashid et al., "Gas-Lift Optimization with Choke Control Using a Mixed-Interger Nonlinear Formulation", Jan. 27, 2011, pp. 2971-2980.

\* cited by examiner

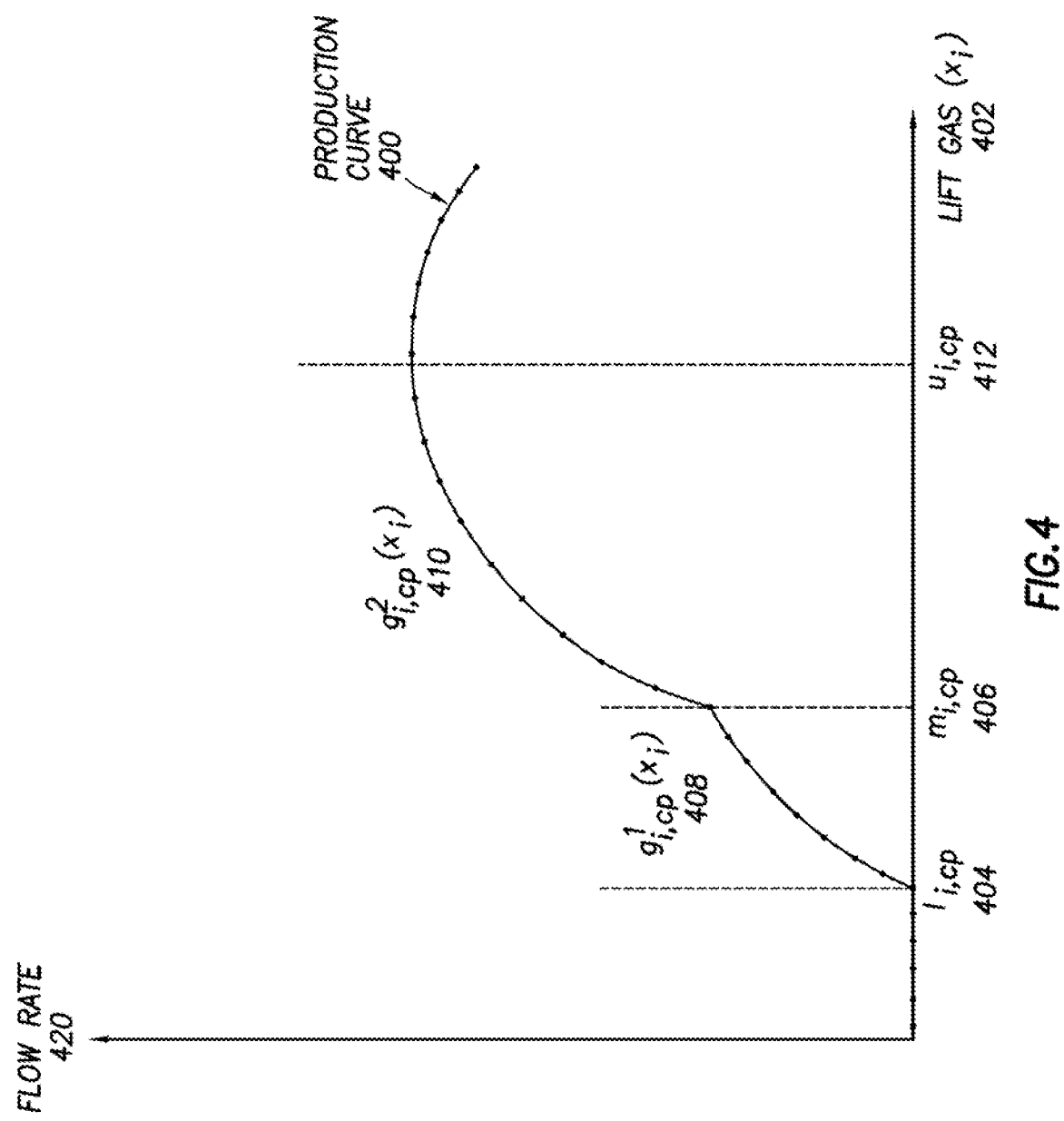

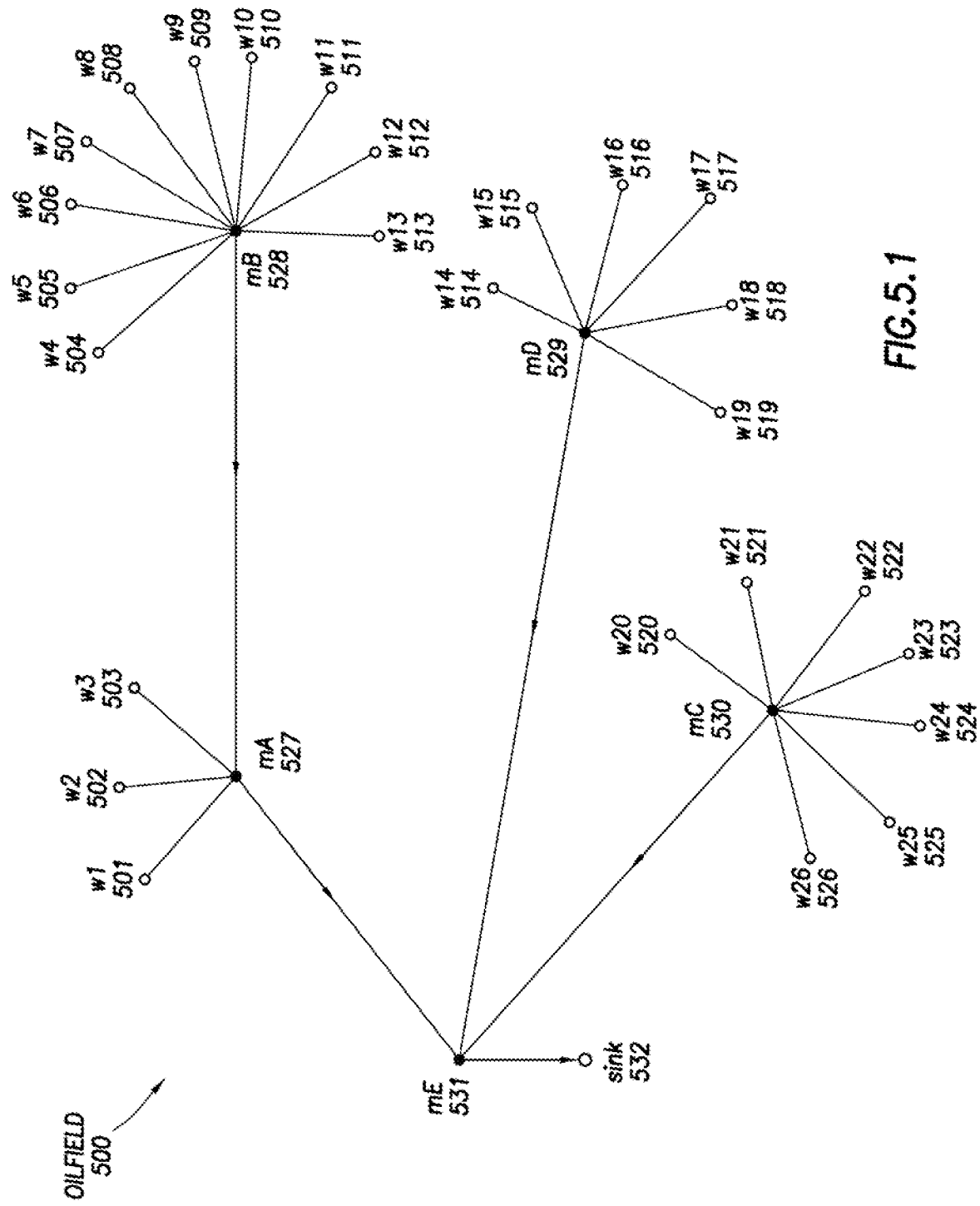
FIG.5.1

GAS-LIFT INJECTION RATES (GLIR) BY ITERATION (mmscfd)

|  |  | INITIAL 540 | OPTIMAL 1 541 | 2 542 | 3 543 | 4 544 | 5 545 | 6 546 |
|---|---|---|---|---|---|---|---|---|
| W01 | 501 | 1 | 0.152634 | 0.15828 | 0.180366 | 0.184535 | 0.640533 | 0.625093 |
| W02 | 502 | 1 | 2.10091 | 2.10933 | 2.11037 | 2.11101 | 2.1326 | 2.13224 |
| W03 | 503 | 1 | 0.1 | 0.1 | 0 | 0 | 0 | 0 |
| W04 | 504 | 1 | 2.19088 | 2.20633 | 2.20721 | 2.2081 | 2.22626 | 2.22603 |
| W05 | 505 | 1 | 1.46037 | 1.45665 | 1.4617 | 1.46197 | 1.56665 | 1.56268 |
| W06 | 506 | 1 | 0.27283 | 0.225277 | 0.245122 | 0.244538 | 0.655652 | 0.639277 |
| W07 | 507 | 1 | 1.92454 | 1.93276 | 1.93413 | 1.9347 | 1.96301 | 1.96223 |
| W08 | 508 | 1 | 2.30848 | 2.32748 | 2.32835 | 2.32954 | 2.34775 | 2.34766 |
| W09 | 509 | 1 | 1.5686 | 1.56287 | 1.56712 | 1.56721 | 1.65521 | 1.65182 |
| W10 | 510 | 1 | 1.6867 | 1.68063 | 1.68399 | 1.68386 | 1.75354 | 1.75081 |
| W11 | 511 | 1 | 1.35482 | 1.34262 | 1.34903 | 1.34893 | 1.48164 | 1.47642 |
| W12 | 512 | 1 | 2.18562 | 2.20028 | 2.20094 | 2.20175 | 2.21542 | 2.21532 |
| W13 | 513 | 1 | 1.88039 | 1.88421 | 1.88569 | 1.88602 | 1.91664 | 1.91565 |
| W14 | 514 | 1 | 2.04466 | 2.0558 | 2.05656 | 2.05641 | 2.07238 | 2.07266 |
| W15 | 515 | 1 | 2.16964 | 2.18096 | 2.18155 | 2.18145 | 2.19377 | 2.19416 |
| W16 | 516 | 1 | 2.39863 | 2.40495 | 2.40568 | 2.40551 | 2.42068 | 2.42059 |
| W17 | 517 | 1 | 1.16318 | 1.6032 | 1.60706 | 1.60594 | 1.68634 | 1.6836 |
| W18 | 518 | 1 | 2.36551 | 2.37178 | 2.3724 | 2.37226 | 2.3853 | 2.38531 |
| W19 | 519 | 1 | 2.03431 | 2.03779 | 2.03896 | 2.03866 | 2.0629 | 2.06251 |
| W20 | 520 | 1 | 2.17106 | 2.17956 | 2.18025 | 2.1802 | 2.19446 | 2.20367 |
| W21 | 521 | 1 | 2.40946 | 2.40588 | 2.4065 | 2.40632 | 2.41913 | 2.41888 |
| W22 | 522 | 1 | 2.03332 | 2.03165 | 2.03355 | 2.03309 | 0 | 0 |
| W23 | 523 | 1 | 1.83444 | 1.84679 | 1.84816 | 1.84795 | 1.87641 | 1.88802 |
| W24 | 524 | 1 | 1.70234 | 1.69912 | 1.70214 | 1.70137 | 1.76406 | 1.77128 |
| W25 | 525 | 1 | 0.613069 | 0.5739 | 0.590607 | 0.586292 | 0.933412 | 0.958393 |
| W26 | 526 | 1 | 2.42361 | 2.4219 | 2.42257 | 2.42237 | 2.43622 | 2.43571 |

ONLINE_OBJECTIVE 534    38774.81   38774.71   38784.98   38784.9   38440.12   38440.02
OFFLINE_OBJECTIVE 533    38292.28   38292.18   38768.97   38768.89   38331.95   38331.85

TIME=180.14 secs   536

FIG.5.2

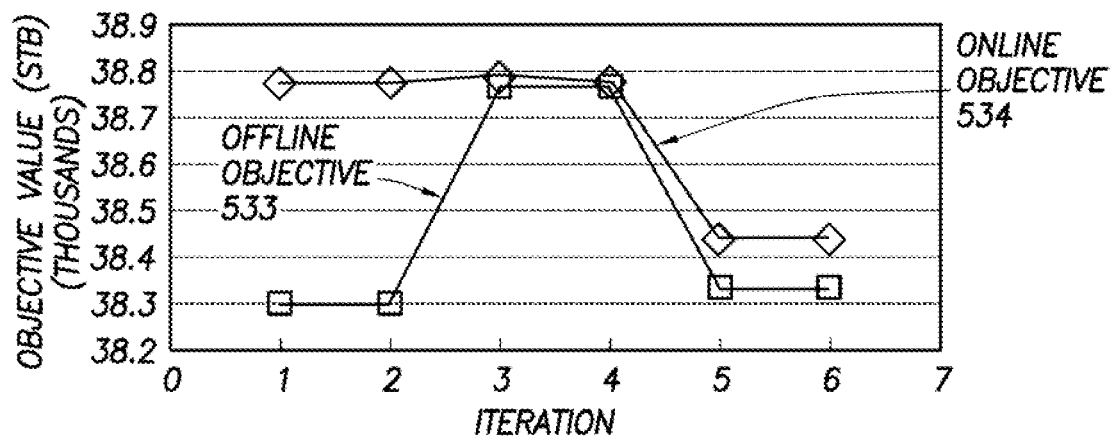
FIG.5.3
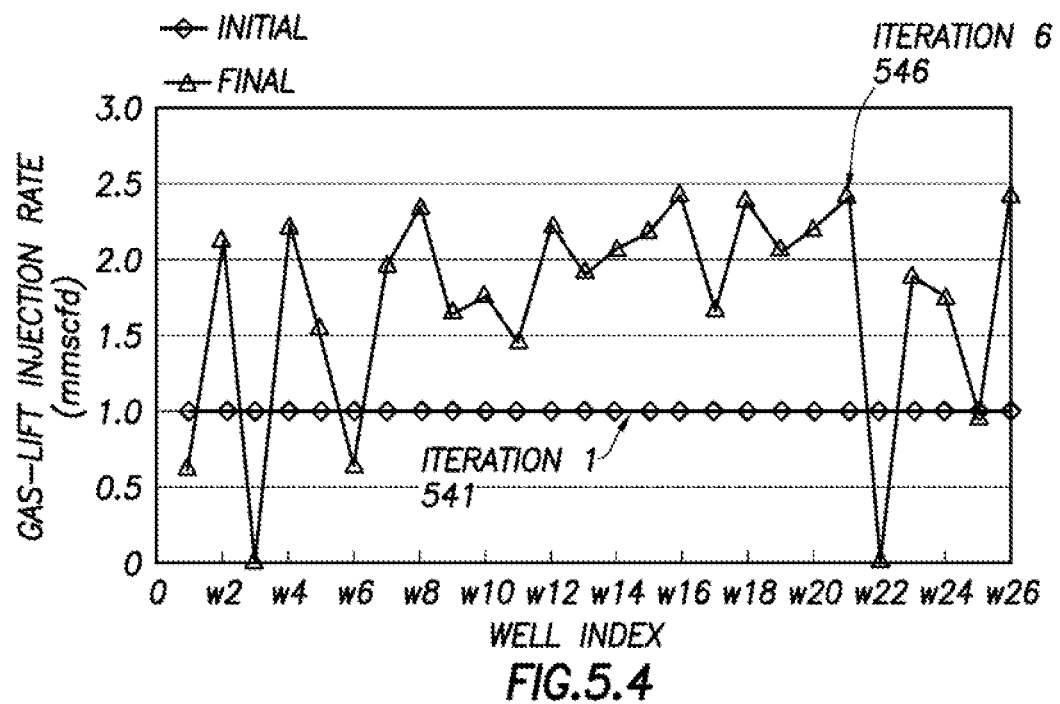
FIG.5.4

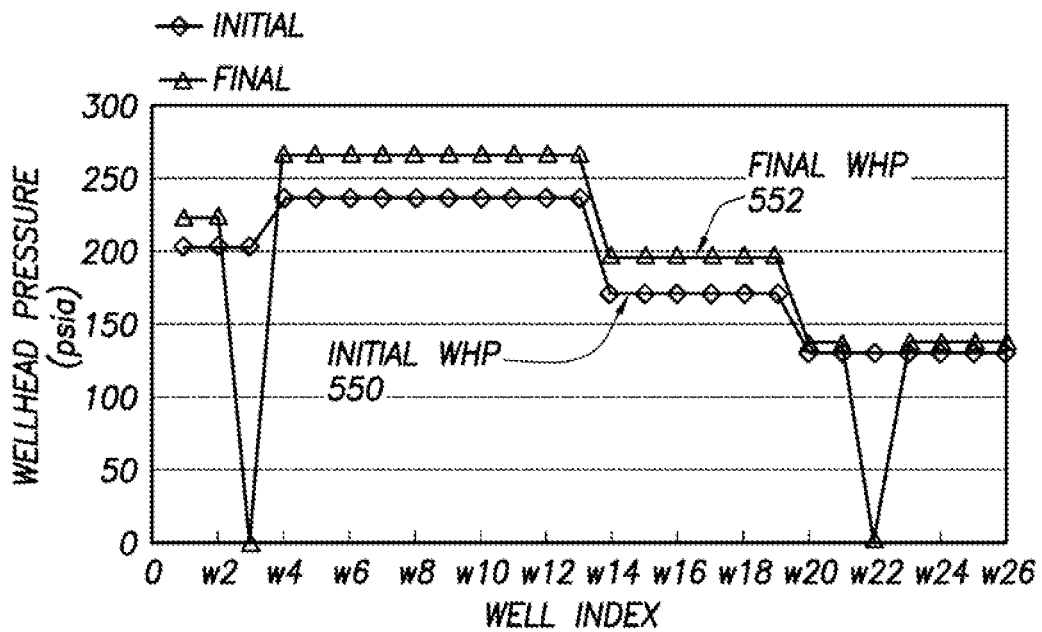
FIG.5.5
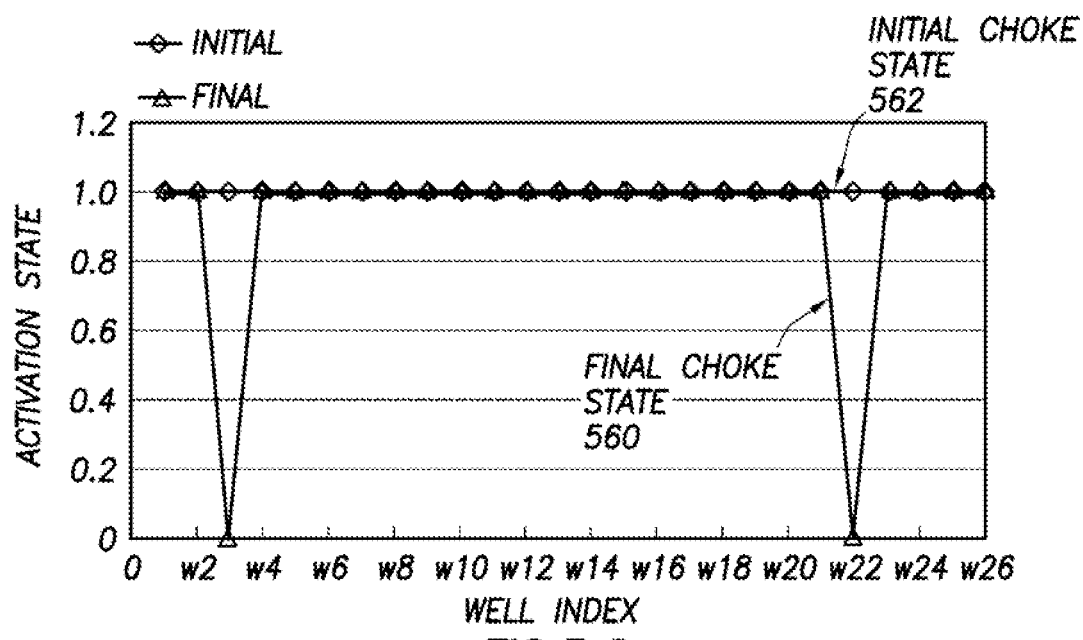
FIG.5.6

| METHOD | POLYTOPE 602 | PROXY-POLYTOPE 604 | GLO 606 | GLO* 608 |
|---|---|---|---|---|
| | | 2-WELL CASE 610 | | |
| $F_{opt}(STB)$ | 2837.2 | 2836.2 | 2837.2 | 2836.0 |
| SIMULATOR CALLS | 20 | 14 | 3 | 2 |
| | | 4-WELL CASE 612 | | |
| $F_{opt}(STB)$ | 5764.2 | 5750.0 | 5762.5 | 5759.0 |
| SIMULATOR CALLS | 59 | 18 | 4 | 2 |
| | | 26-WELL CASE 614 | | |
| $F_{opt}(STB)$ | 45,913 | 45,922 | 45,905 | 45,838 |
| SIMULATOR CALLS | 179 | 88 | 4 | 3 |
| | | 100-WELL CASE 616 | | |
| $F_{opt}(STB)$ | 27,438 | | 27,365 | 27,336 |
| SIMULATOR CALLS | 369 | >101 | 8 | 3 |

FIG.6

OPTIMIZATION WITH A CONTROL MECHANISM USING A MIXED-INTEGER NONLINEAR FORMULATION

CROSS-REFERENCE TO RELATED APPLICATIONS

This application is a continuation application of and, thereby, claims benefit under 35 USC. §120 to U.S. application Ser. No. 13/253,680, filed on Oct. 5, 2011, and entitled, "GAS-LIFT OPTIMIZATION WITH CHOKE CONTROL USING A MIXED-INTEGER NONLINEAR FORMULATION," and incorporated herein by reference. Further, U.S. application Ser. No. 13/253,680 claims benefit under 35 U.S.C. §119(e) of U.S. Provisional Patent Application No. 61/392,530, filed on Oct. 13, 2010, and entitled "GAS-LIFT OPTIMIZATION WITH CHOKE CONTROL USING A MIXED-INTEGER NONLINEAR FORMULATION," which is hereby incorporated by reference.

BACKGROUND

An oilfield production network ("network") includes a number of interconnected wells, branches, manifolds, separators, storage facilities, and other elements to aid the extraction and transport of hydrocarbons from a source (the reservoir via the wells) to a sink (a downstream delivery point). At times, production engineers use computer models of the network for production operation purposes. Such models simulate multi-phase flow behavior through the network and are used for investigation and prediction purposes, such as, but not limited to, production monitoring, facility design and sizing, scenario analysis, multi-phase flow assurance, and field pressure management to ensure hydrocarbon flow to a delivery sink.

From an operational point of view, one objective is to maximize production (or profit) from the produced, and saleable, oil and gas components, while minimizing production costs and meeting all existing operating constraints. The constraints include, for example, limits on storage, fluid flow velocities through pipes to prevent erosion, temperature levels for hydrate formation prevention, budget, and the availability of natural gas for artificial lift purposes. At times, different procedures may be used to enhance production from one or more wells. For example, changes in pressure at various locations in the network of wells, through the use of flow control devices, may induce additional hydrocarbons (e.g., oil, gas) from a reservoir for extraction.

SUMMARY

In general, in one aspect, the application relates to a method of optimizing production of wells using choke control. The method includes generating, for each well, an intermediate solution to optimize the production of each well. The generating includes using an offline model that includes a mixed-integer nonlinear program solver and includes using production curves based on a choke state and a given wellhead pressure. The method further includes calculating, using a network model and the intermediate solution of each well, a current online wellhead pressure for each well, where the current online wellhead pressure for each well is dependent upon each other well. The method further includes setting the intermediate solution as a final solution based on determining that a difference between the current online wellhead pressure of each well and a prior online wellhead pressure of each well is less than a tolerance amount. The final solution of each well identifies a value for the at least one operating parameter. The method further includes adjusting, using the final solution of each well, at least one operating parameter of the wells to generate an actual wellhead pressure of each well.

In general, in one aspect, the application relates to a system for optimizing production of a plurality of wells using choke control. The system includes a hardware processor, sensors for collecting data from the wells, an offline model executing on the hardware processor, a network model operatively connected to the offline model and executing on the hardware processor, and an optimization engine operatively connected to the offline model and the network model. The offline model generates, for each well, an intermediate solution to optimize the production of each well using the data collected by the sensors, a mixed-integer nonlinear program solver, and production curves based on a choke state and a given offline wellhead pressure. The network model calculates, using each intermediate solution of each well, a current online wellhead pressure for each well. The current online wellhead pressure for each well is dependent upon each other well. The optimization engine sets the intermediate solution as a final solution based on determining that a difference between the current online wellhead pressure of each well and a prior online wellhead pressure of the each well is less than a tolerance amount. The final solution of each well identifies a value for the at least one operating parameter. The optimization engine further adjusts, using final solution of each well, at least one operating parameter of the wells to generate an actual wellhead pressure of each well.

In general, in one aspect, the application relates to a computer readable medium that includes computer readable program code embodied therein for generating, for each well, an intermediate solution to optimize the production of each well. The generating includes using an offline model that includes a mixed-integer nonlinear program solver and includes using production curves based on a choke state and a given wellhead pressure. The computer readable program code embodied is further for calculating, using a network model and the intermediate solution of each well, a current online wellhead pressure for each well, where the current online wellhead pressure for each well is dependent upon each other well. The computer readable program code embodied is further for setting the intermediate solution as a final solution based on determining that a difference between the current online wellhead pressure of each well and a prior online wellhead pressure of each well is less than a tolerance amount. The final solution of each well identifies a value for the at least one operating parameter. The computer readable program code embodied is further for adjusting, using the final solution of each well, at least one operating parameter of the wells to generate an actual wellhead pressure of each well.

This summary is provided to introduce a selection of concepts that are further described below in the detailed description. This summary is not intended to identify key or essential features of the claimed subject matter, nor is it intended to be used as an aid in limiting the scope of the claimed subject matter.

Other aspects of lift-gas optimization with choke control will be apparent from the following description and the appended claims.

BRIEF DESCRIPTION OF DRAWINGS

The appended drawings illustrate several embodiments of lift-gas optimization with choke control and are not to be considered limiting of its scope, for lift-gas optimization with choke control may admit to other equally effective embodiments.

FIG. 4 shows an example production curve for a well using lift-gas optimization with choke control in accordance with one or more embodiments.

FIGS. 5.1-5.6 depict an example for lift-gas optimization with choke control in accordance with one or more embodiments.

FIG. 6 shows a table comparing model test results using lift-gas optimization with choke control in accordance with one or more embodiments.

DETAILED DESCRIPTION

Figure 1:
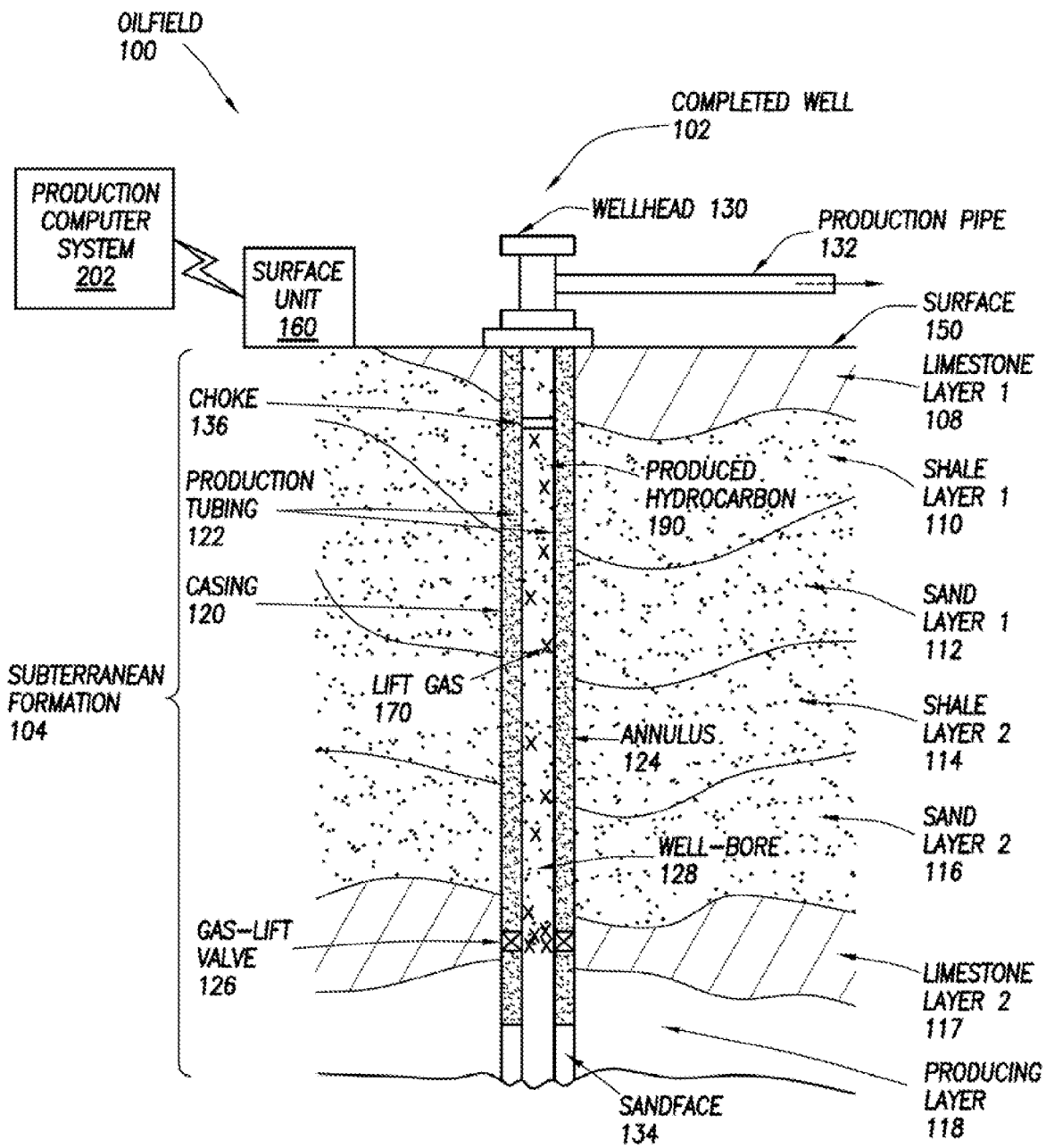
FIG. 1 is a schematic view, in cross-section, of a completed well in an oilfield in which one or more embodiments of lift-gas optimization with choke control may be implemented.

Embodiments are shown in the above-identified drawings and described below. In describing the embodiments, like or identical reference numerals are used to identify common or similar elements. The drawings are not necessarily to scale and certain features may be shown exaggerated in scale or in schematic in the interest of clarity and conciseness.

Embodiments of the disclosure include a method, system, and computer readable medium for optimizing production of a network using lift-gas optimization with choke control. Example systems and methods described herein enable users to modify operating parameters for one or more wells in the network to maximize production and/or minimize cost. Specifically, embodiments of the disclosure include an iterative offline-online modeling procedure to optimize lift-gas with choke control to meet an objective function (e.g., increase production, reduce cost) for the network.

As used herein, the terms lift-gas, gas-lift, lift gas, and gas lift shall mean a gas that is injected into a production wellbore to induce hydrocarbons to enter the wellbore from a producing zone by reducing pressure at specific locations in the wellbore. Further, as used herein, an iterative online-offline procedure (or similarly worded procedure) shall mean iteratively running an offline model (defined below) using the results of the offline model to run a network (i.e., online) model, and, if there is no acceptable convergence between the online and offline models, repeating the process, using the output of the network model from the previous iteration for input to the offline model in the subsequent iteration.

In order to establish a lift-gas injection rate, together with the settings of other components of concern in a network simulation, a nonlinear optimization problem may be presented. Furthermore, given that certain decision variables may be discrete (e.g., block valves with on/off states or fixed position chokes), a mixed-integer nonlinear program solver may be developed and implemented in one or more embodiments to achieve a specific goal, stated by objective function.

In one or more embodiments, lift gas is used to enhance production for a network of completed wells. Specifically, individual well productivity for a network of wells may be improved by injection of lift gas (e.g., natural gas) at high pressure directly into a wellbore containing fluid from a reservoir or producing layer. The reduced density of the fluid column caused by the injection of the lift gas effectively lowers the flowing bottom-hole pressure causing an increased pressure differential. The increased pressure differential induced across the sandface (described below) assists greater fluid production up to the surface. However, as described below with respect to FIG. 4, injecting too much lift gas may increase the frictional pressure drop and lower the possible production. One or more embodiments are configured to determine a desirable lift gas quantity and choke state (i.e., choke position) for each well in a network of wells to optimize production from each well.

In one or more embodiments, the choke state of a choke at one or more wells in a network are used to restrict flow of produced hydrocarbons. As a result, an additional layer of control may be used, in addition to the lift gas injection, to optimize the production of the network of wells and also to meet certain operating constraints. As explained above, a network is a number of interconnected wells, branches, manifolds, separators, storage facilities, and other elements to aid the extraction and transport of hydrocarbons from a source (the reservoir via the wells) to a sink (a downstream delivery point). One or more embodiments simultaneously model both the lift gas rate and the choke state for each well. Further, because of the offline definition described herein, the offline problem posed is convex (i.e., the optimal offline solution can be obtained with greater ease and used in the network model to aid convergence of the overall procedure).

FIG. 1 depicts a schematic view, in cross-section, of a completed well (102) in an oilfield (100) in which one or more embodiments of lift-gas optimization with choke control are implemented. One or more of the modules and elements shown in FIG. 1 may be omitted repeated, and/or substituted. Accordingly, embodiments of lift-gas optimization with choke control should not be considered limited to the specific arrangements of modules shown in FIG. 1.

As shown in FIG. 1, the oilfield (100) shows the completed well (102) in a subterranean formation (104). In one or more embodiments, the completed well (102) is one of a network of wells in the oilfield (100). The subterranean formation (104) of the oilfield (100) includes several geological structures. As shown, the formation has limestone layer 1 (108), shale layer 1 (110), sand layer 1 (112), shale layer 2 (114), sand layer 2 (116), limestone layer 2 (117), and a producing layer (118). In one or more embodiments, various survey tools and/or data acquisition tools are adapted to measure the formation and detect the characteristics of the geological structures of the formation before and during, the exploration process.

As shown in FIG. 1, the completed well (102) includes casing (120), inside of which is production tubing (122) that extends into the producing layer (118). The production tubing (122) has an annulus (124) into which lift-gas (170) is injected from the surface (150). The lift gas (170) travels down the annulus (124) of the production tubing (122) and exits through the lift gas valve (126) into the wellbore (128). The lift gas valve (126) in this instance is placed just above the producing layer (118) in the second limestone layer (117). The lift gas valve (126) may be placed at any layer in the subterranean formation (104), depending on the well completion and the selected objective function for the network, and is used to control an amount of lift gas (170) that enters the well bore (128). In addition, multiple lift gas valves (126) may be placed at multiple levels in the annulus (124).

As the lift gas (170) enters the wellbore (128), the pressure inside the wellbore (128) drops. As a result, the pressure measured at the bottom of the wellbore (128) (i.e., the bottom-hole pressure) is less than the pressure inside the producing layer (118) (i.e., the in situ reservoir pressure). Because of the pressure differential, the hydrocarbons in well are pushed to surface and more fluid from the producing layer (118) is induced into the wellbore (128) to become produced hydrocarbons (190). The produced hydrocarbons (190) are then brought to the surface (150), through the wellhead (130), and into the production pipe (132).

Further as shown in FIG. 1, the area where the bottom of the casing (120) (as well as, in this case, the bottom of the production tubing (122)) meets the producing layer is the sandface (134). The bottom-hole pressure exists at the bottom of the wellbore (128) at the sandface (134). The wellbore (128) is capped at the surface (150) by a wellhead (130), which maintains a wellhead pressure to draw out the produced hydrocarbons (190).

Just below the surface (150), at the top of the limestone layer (108), a choke (136) is placed inside annulus (124). The choke (136) has an adjustable orifice that controls the flow rate of the fluid in the wellbore (128), including the produced hydrocarbons (190), to the surface (150). The choke (136) may be adjusted to a fully open position, a fully closed position, or any position between fully open and fully closed.

Further as shown in FIG. 1, a production pipe (132) extends from the wellhead (130) to transport the produced fluid (e.g., including hydrocarbons (190)) that are brought to the surface (150) from the subterranean formation (104). The wellhead pressure is maintained at a certain level in order to maintain a pressure differential with the bottom hole pressure.

In one or more embodiments, the oilfield (100) is associated with sensors, production equipment (e.g., pumps, motors, compressors), and other elements used to produce hydrocarbons from the oilfield (100), and is configured to perform wellbore operations, such as fracturing, production, or other applicable operations. Generally, production operations are referred to as field operations of the oilfield (100). These field operations are typically performed as directed by the surface unit (160).

In one or more embodiments, the surface unit (160) is operatively coupled to the completed well (102), as well as other wells, in the oilfield (100). In particular, the surface unit (160) is configured to communicate with one or more elements of the oilfield (100) (e.g., sensors, production equipment), to send commands to the elements of the oilfield (100), and to receive data therefrom. For example, the production equipment (e.g., a pump used to inject the lift gas (170) into the annulus (124), choke state of the choke (136)) may be adjusted. (e.g., to inject a greater amount of lift gas (170) into the annulus (124) or to control the flow rate in the well) based on a command sent by the surface unit (160). In one or more embodiments, the surface unit (160) derives commands sent to the production equipment based on one or more final solutions (described below) generated by the iterative online-offline procedure described herein. In particular, the state of various production equipment, such as choke position and amount of lift gas, may be dictated by the final solution(s) generated by the iterative online-offline procedure, thereby adjusting the production of hydrocarbons in the oilfield.

The surface unit (160) may be located at the oilfield (102) and/or remote locations. The surface unit (160) may be provided with computer facilities for receiving, storing, processing, and/or analyzing data from the elements of the oilfield (100). The surface unit (160) may also be provided with functionality for actuating elements at the oilfield (100). The surface unit (160) may then send command signals to the oilfield (100) in response to data received, for example, to control and/or optimize production of the network of wells in the oilfield (100).

In one or more embodiments, the data received by the surface unit (160) represents characteristics of the subterranean formation (104) and may include seismic data and/or information related to porosity, saturation, permeability, natural fractures, stress magnitude and orientations, elastic properties, etc. collected prior to completion of a well during a drilling, fracturing, logging) or during production operations of the wellbore (128) at the completed well (102). Other data may also be collected, including, but not limited to, historical data, user inputs, economic information, other measurement data, and other parameters of interest.

In one or more embodiments, the surface unit (160) is communicatively coupled to a production computer system (202) (described below with respect to FIG. 2). The data received by the surface unit (160) may be sent to the production computer system (202) far further analysis. Generally, the production computer system (202) is configured to analyze, model, control, optimize, or perform other management tasks of the aforementioned field operations based on the data provided from the surface unit (160). In one or more embodiments, the production computer system (202) is provided with functionality for manipulating and analyzing the data to identify geological surfaces in the subterranean formation (104) or to perform simulation, planning, and optimization of production operations of the wellsite system (204). The result generated by the production computer system (202) may be displayed for a user viewing using a 2 dimensional (2D) display, a 3 dimensional (3D) display, and/or one or more other suitable displays. Although the surface unit (160) is shown as separate from the production computer system (202) in FIG. 1, in other examples, the surface unit (160) and the production computer system (202) may also be combined.

Figure 2:
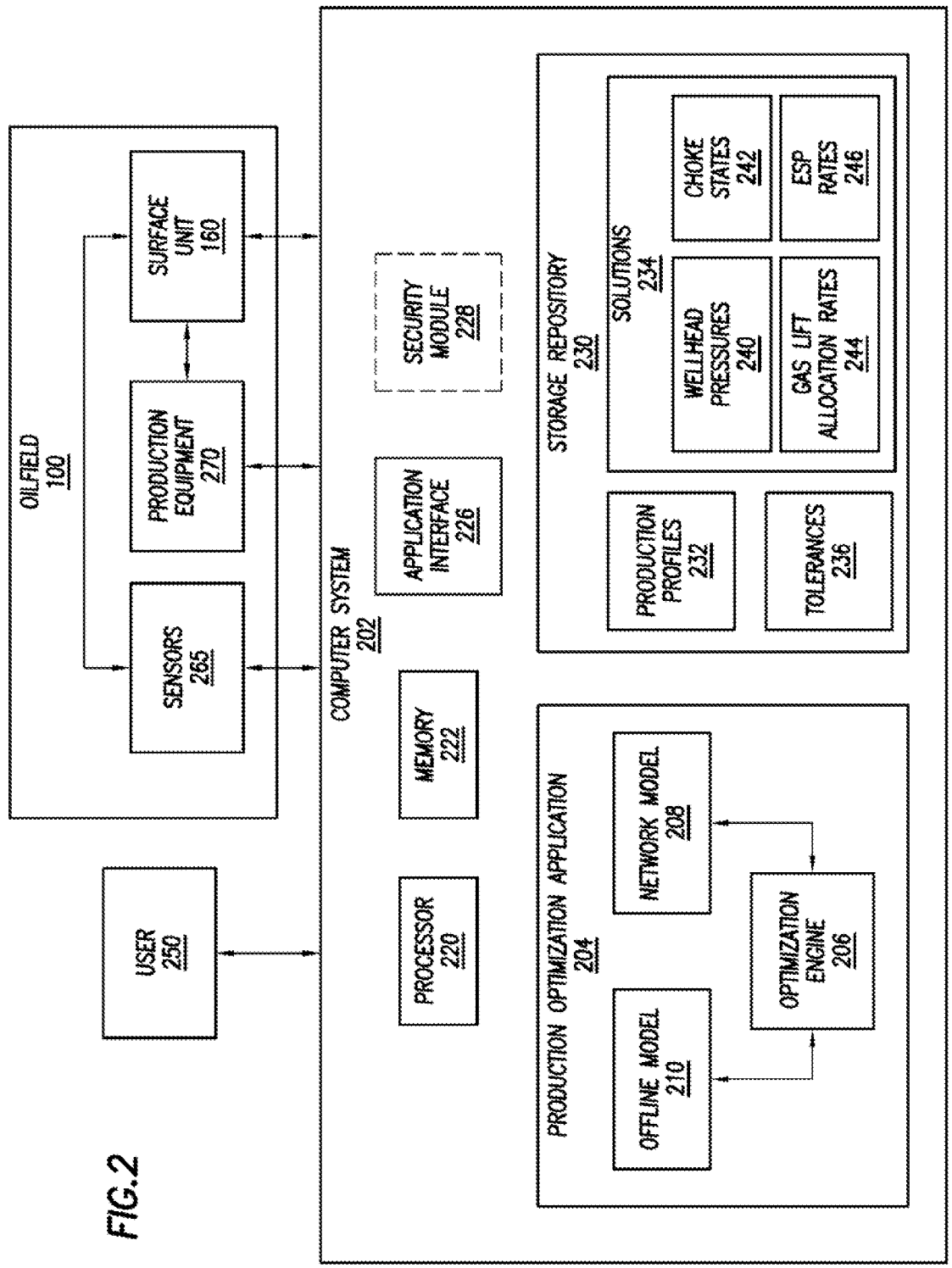
FIG. 2 shows a system for lift-gas optimization with choke control in accordance with one or more embodiments.

FIG. 2 shows a system for lift-gas optimization with choke control in accordance with one or more embodiments. One or more of the modules and elements shown in FIG. 2 may be omitted, repeated, and/or substituted. Accordingly, embodiments of knowledge capture and sharing of exploration and production tool sessions should not be considered limited to the specific arrangements of modules shown in FIG. 2.

As shown in FIG. 2, the production computer system (202) includes a production optimization application (204), a storage repository (230), a processor (220), memory (222), an application interface (226), and, optionally, a security module (228). The production, optimization application (204) includes an optimization engine (206), a network model (208), and an offline model (210). The storage repository (230) includes production profiles (232), solutions (234) (which include wellhead pressures (240) and choke states (242)), and tolerances (236). The production computer system (202) is also operatively connected with a user (250) and a surface unit (260) within an oilfield (100). The surface unit (160) communicates with sensors (265) and production equipment (270) within the oilfield (100). Each of these elements is described below.

In one or more embodiments, the production computer system (202) is implemented according to a client-server topology. The production computer system (202) may correspond to enterprise software running on one or more servers, and in some embodiments is implemented as a peer-to-peer system, or resident upon a single computing system. In addition, the production computer system (202) may be accessible from other machines using one or more application programming interfaces and/or user interfaces (not shown). The production computer system (202) may be accessible over a network connection (not shown), such as the Internet, by one or more users (e.g., engineer, production supervisor). Further, information and/or services provided b the production computer system (202) may also be stored and accessed over the network connection.

The production computer system (202) may be a local computer system of the user (250). The production computer system (202) may, optionally, not be implemented using a client-server topology. For example, the production computer system (202) may correspond to a laptop computer, desktop computer, mobile device, or another type of computing device, or combination of multiple computing devices. Additionally or alternatively, the production computer system (202) may be a distributed computer system and/or multiprocessor computer system in which the computer system includes multiple distinct computing devices.

Continuing with FIG. 2, the user (250) sends data to and receives data from the production computer system (202). Examples of data that the user (250) may send to the production computer system (202) include, but are not limited to, user preferences, settings, operating constraints, and financial constraints. Examples of data that the user (250) may receive from the production computer system (202) include, but are not limited to, operating parameters (including a choke state of one or more chokes), production data, production profiles, and lift gas flow. The user (250) may be an engineer, a production supervisor, an accountant, a risk manager, or some similar individual or software program involved in the production of the network of wells.

The production computer system (202) may also be implemented as a browser extension. In such a scenario, user software may interact directly with the production computer system (202) as a browser extension.

Continuing with FIG. 2, the production computer system (202) is configured to interact with the user (250). Specifically, the application interface (226) of the production computer system (202) is configured to receive data from and send data to the user (250). The device (e.g., computer) used by the user (250) may include an interface to receive data from and send data to the computer system (102). Examples of an interface may include, but are not limited to, a graphical user interface, an application programming interface, a keyboard, a monitor, a mouse, a web service, a data protocol adapter, some other hardware and/or software, or any suitable combination thereof.

The oilfield (100) may be the same oilfield described above with respect to FIG. 1. The oilfield (100) includes all of the land (above, at, and under the surface), materials, equipment, and any other elements used in the production of a network of wells. The surface unit (160) of the oilfield (100) may be the same as, or have the same functionality as, the surface unit described above with respect to FIG. 1. The surface unit (160) may communicate with (e.g., receive data from, send instructions to, adjust a mode of operation for) the sensors (265) and the production equipment (270).

In one or more embodiments, the sensors (265) are any measuring and/or monitoring devices located anywhere in the oilfield (100). Examples of sensors (265) include, but are not limited to, pressure gauges, flow gauges, gas monitors, voltmeters, and ammeters. Production equipment (270) may include any device that is used to produce hydrocarbons from the oilfield. Examples of production equipment (270) include, but are not limited to, pumps, motors, chokes, production tubing, casing, and piping.

In one or more embodiments, the production computer system (202) includes the production optimization application (204) having software instructions stored in memory (222) and executing on the processor (220). The production optimization application (204) includes functionality to communicate with the surface unit (160) for receiving data from the surface unit (160) and for managing (e.g., adjust one or more operating parameters of production equipment (270), analyze, model, control, optimize, and/or perform other field operation tasks) the aforementioned field operations based on the received data. In one or more embodiments, the received data is stored in the data repository (230) to be processed by the production optimization application (204).

In one or more embodiments, the processing computer system (202) is configured to use the optimization engine (206) to retrieve and store production profiles (232), solutions (234) (including wellhead pressures (240) and choke states (242)), and tolerances (236) in the storage repository (230) in accordance with one or more embodiments. The production profiles (232) are one or more production curves for a well. A production curve for a well represents production of a well under a range of values for two or more operating variables. For example, a production curve may represent a flow rate of produced hydrocarbons based on a range of volumes and/or pressures of lift gas. FIG. 4 below describes production curves further.

In one or more embodiments, solutions (234) are values (e.g., pressure, choke state, gas-lift rates) that are calculated as optimal values for an iteration of an offline model (described below) for a particular well in a network. Specifically, a solution represents a value (or range of values) at which an element that controls the production of hydrocarbons in the oilfield operates at. For example, the solution for injecting lift gas in a particular well in a network may be 3 million standard cubic feet per day (MMscfd) at 100 psi. As another example, the solution for a choke state at a given well in the network may be 50% open. During, the interation process, the solution may be referred to herein as an intermediate solution. When convergence is achieved and the difference between a prior on hue wellhead pressure and a current a prior online wellhead pressure is less than a tolerance amount, the current intermediate solution may be referred to as a final solution. In other words, the word, "final", with regards to solution means that the solution is the last solution generated before convergence of the iteration process is identified. The word, "final", is not to imply that additional steps or iterations may not be performed.

In one or more embodiments, wellhead pressures (240) are a value of pressure at the wellhead. In one or more embodiments, the gas-lift allocation rates (244) indicate the amount of lift gas injected into each well in a network. The wellhead pressures (240) may be actual pressure values used in production operations and/or values of pressures that were calculated during a previous iteration of the online-offline procedure and to which the gas lift allocation rates (244) corresponds.

In one or more embodiments of the invention, the electronic submersible pump (ESP) rates (246) for horsepower allocation. The ESP rates (246) are the amount of horsepower used for each well in the network. In other words, rather than gas-lift allocation versus production, the production curves may be based on horse-power allocation versus production. Thus, the gas-lift rates may be replaced in the following discussion with ESP rates to obtain a final solution for electronic submersible pumps. Similar to gas lift rates and ESP rates, other control variables that may be specified with production profiles for each well may be used without departing from the scope of the discussion herein. In other words, the methodology disclosed herein may be used for other control variables.

In one or more embodiments, choke states (242) are a position of the choke to restrict production flow to the surface for each well in the network. A choke state may be fully open, fully closed, or some percentage of open (or closed). The choke states (242) may be actual choke states used in production operations and/or choke states that were calculated during a previous iteration of the online-offline procedure.

In one or more embodiments, tolerances (236) are one or more values used to determine whether an additional iteration in the online-offline procedure should be performed. A tolerance may be a unitless number, a percentage, or some other value that represents whether a value or series of values from the offline model are sufficiently close to a value or series of values from the online model.

The storage repository (230) (and/or any of the data stored therein) may be a data store such as a database, a file system, one or more data structures (e.g., arrays, link lists, tables, hierarchical data structures) configured in a memory, an extensible markup language (XML) file, any other suitable medium for storing data, or any suitable combination thereof. The storage repository (230) may be a device internal to the production computer system (202). The storage repository (230) may also be an external storage device operatively connected to the production computer system (202).

The storage repository (230) may be operatively connected to the production optimization application (204). Specifically, the optimization engine (206) of the production optimization application (204) may be configured to retrieve data from, and send data to, the storage repository (230). Further, in one or more embodiments, the optimization engine (206) of the production optimization application (204) is configured to coordinate the operation of and the transfer of data with, the network model (208) and the offline model (210). The optimization engine (206) may further be configured to test for convergence between the offline wellhead pressure and the online wellhead pressure arrays, and communicate parameters to the surface unit for changing the state of one or more components of production equipment.

In one or more embodiments, the network model (208) executes a set of instructions, using software and hardware, to deliver a result. Specifically, the network model (208) performs one or more simulations while considering all wells in an integrated network. The network model (208) may be referred to as an online model. The network model (208) is a representation of the actual gathering system at prevailing time.

In general, the simulation run by the network mode (208) can be summarized as:

$$\max F_{nw} = f_{online}(X, Y; \rho), \text{ where}$$

$$g_j(X,Y) \leq 0 \; j=[1, \ldots, J_1]$$

$$h_k(X,Y) = 0 \; k=[1, \ldots, K_1]$$

$$X \in R^{N_1}, Y \in N^{M_1},$$

where X is the vector of continuous decision variables (e.g., gas-lift rates), Y is the vector of discrete decision variables (e.g., choke states), nw stands for network, $\rho$ describes the set of fixed model parameters (e.g., network topology, boundary conditions, flow correlations, fluid compositions, etc.), $g_j(X,Y)$ represents the j-th inequality constraint, and $h_k(X,Y)$ the k-th equality constraint.

In one or more embodiments, the network model (208) receives a solution (described below) for each well from the offline model (210) through the optimization engine (206). The network model (208) uses the solutions to perform the calculations of the network model (208). The output or result of the network model (208) may vary, depending on the objective function. In one or more embodiments, the network model (208) calculates an online wellhead pressure for each well in the network given the lift gas allocation rates provided from the offline model (210).

In one or more embodiments, the offline model (210) executes a set of instructions, using software and hardware, to deliver a result. Specifically, the offline model (110) performs calculations for each well with wellhead pressure provided from the network model (208).

In general, the calculations performed by the offline model (210) can be summarized as:

$$\max F_{sep} = f_{offline}(X, Y; P), \text{ where}$$

$$g_j(X,Y) \leq 0 \; j=[1, \ldots, J_2]$$

$$h_k(X,Y) = 0 \; k=[1, \ldots, K_2]$$

$$X \in R^{N_2}, Y \in N^{M_2},$$

where, similarly, X and Y are the vectors of continuous and discrete decision variables, respectively, as described above. However, the number of variables and constraints ($N_2$, $M_2$, $J_2$, $K_2$) defined in the offline model (210) are not the same as the variables and constraints ($N_1$, $M_1$, $J_1$, $K_1$) defined in the network model (208) due to the difference in model definition.

In one or more embodiments, the offline model (210) generates production profiles for each well in a network. The production profiles may also be generated by the network model (208), provided by the repository (232) and/or some other source (e.g., the user (250), a separate application). The production profiles may be one or more production curves for one or more of the wells in a network for a given sensitivity parameter (e.g., gas-lift rate, ESP power, etc.).

In one or more embodiments, the offline model (210) uses the online wellhead pressure solution (240) for each well in a network. The offline wellhead pressure of a well represents the pressure at the wellhead for the well for the current iteration of the online-offline procedure. The offline model (210) may generate the offline gas lift allocation rates to each well given the wellhead pressure to set production profiles each well. The offline model (210) may also generate the choke state of each well.

In one or more embodiments, the offline model (210) determines the production curve for each well in a network. The production curve may be one of the production curves among the production profiles described above. The production curve represents the operating conditions of the well in the current iteration of the online-offline process. The offline model (210) may select the appropriate production curve from the production curves in the production profile for the well. The offline model (210) may determine the appropriate production curve for a well, in part, using the offline wellhead pressure of the well. If the appropriate production curve is not among the production profile, then the offline model (210) may generate the production curve by interpolation in embodiments of the invention.

A production curve may be described as smooth and instantaneous (SI), smooth and non-instantaneous (SNI), non-smooth and instantaneous (NSI), or non-smooth and non-instantaneous (NSNI). The smooth and instantaneous production curve indicates when a well produces with no lift gas delivered to the well. The smooth and non-instantaneous production curve indicates when some minimum level of lift-gas injection is used before the flow of produced hydrocarbons commences in the well. The non-smooth and instantaneous production curve indicates when the well produces with no lift gas delivered to the well, but the production curve is non-smooth. The non-smooth and non-instantaneous production curve indicates when some minimum level of lift-gas injection is used before the flow of produced hydrocarbons commences in the well, but when the production curve is non-smooth.

In one or more embodiments, the offline model (210) generates an intermediate solution that optimizes the production over all wells. The offline model (210) generates the intermediate solution for each well, while taking the conditions of the network into account (e.g., the wellhead pressures (240) from the network model (208)). The intermediate solution indicates the optimal decision variable values for both the gas lift rate and the choke state for each well for the current iteration of the online-offline process. The offline model (210) will use the production curve for the given wellhead pressure and choke state for each well in order to generate the prevailing solution in one or more embodiments.

The offline model (210) may set a choke state for a well to fully closed in order to meet operating constraints. For example, if the well is viewed to inhibit convergence or is deemed inefficient for operation based on a ranking procedure, the well may be deactivated by setting the choke state to fully closed. The offline model (210) may also set a choke state for a well to fully closed if the well ranks the lowest in the network after convergence of the online-offline procedure. In such cases, deactivating the lowest ranking well in the network increases stability in the online-offline iteration process. In other words, if a well is deemed to inhibit convergence between the online wellhead pressure and the offline wellhead pressure or is inefficient in practical operation, then it will be deactivated by setting the choke state for that well to fully closed.

In one or more embodiments, the offline model (210) uses a mixed-integer nonlinear program (MINLP) solver to generate the solution. The mixed-integer nonlinear program solver may also solve a nonlinear program if no integer variables are assigned. The mixed-integer nonlinear program solver may also solve a mixed-integer linear program if the offline model (210) is posed as linear problem with integer variables, and as linear program solver if no integer variables are defined. In the linear case, the nonlinear production profiles may be represented using piece-wise linear segments. Thus, the mixed-integer nonlinear program solver can perform calculations using both binary and continuous variables, depending on the definition of the offline model (210). In one or more embodiments, the offline formulation of the offline model (210) is convex. In other words, the solution identified by the offline model is the best possible solution in one or more embodiments. Further, in one or more embodiments, the mixed integer nonlinear program solver may solve nonlinear and linear problems.

The following discussion provides an explanation of a mixed integer solver in accordance with one or more embodiments. The following table provides a definition of each symbol used in the discussion below.

| Symbol | Definition |
|---|---|
| $C_p$ | choke position |
| $C_g$ | cost per unit (MMscfd) gas used |
| $C_w$ | cost per unit (STB) water processed |
| C | available lift-gas constraints |
| $F_{offline}$ | function representing offline model |

-continued

| Symbol | Definition |
|---|---|
| $F_{online}$ | function representing network model |
| $F_{nw}$ | objective function value from network model |
| $F_{sep}$ | objective function value from the offline model |
| $F_{opt}$ | optimal objective function value |
| $G_j(X, Y)$ | j-th vector of inequality constraints |
| $G^t_{i,cp}$ | i-th well with choke position cp- production curve t |
| $H_k(X, Y)$ | k-th vector of equality constraints |
| i | counter |
| j | counter |
| J | number of inequality constraints |
| k | counter or number of choke positions |
| K | number of equality constraints |
| $l_{i,cp}$ | i-th well with choke position cp- gas-lift lower bound |
| $l^t_{i,cp}$ | i-th well with choke position cp on region t- gas-life lower bound |
| $m_{i,cp}$ | i-th well with choke position cp- gas-lift intermediate bound |
| M | number of integer control variables |
| n | number of wells |
| $n_c$ | number of operating constraints applied |
| N | number of continuous control variables |
| $P_g$ | profit per unit (MMscfd) gas sold |
| $P_o$ | profit per unit (STB) oil sold |
| P | vector of wellhead pressure |
| q | vector of liquid flow rates [n, l] |
| $Q_{i,cp}$ | i-th well with choke position cp- flow rate |
| $q_g^{max}$ | maximum produced gas constraints bound |
| $q_l^{max}$ | maximum produced liquid constraints bound |
| $q_o^{max}$ | maximum produced oil constraints bound |
| $q_w^{max}$ | maximum produced water constraints bound |
| $u_{i,cp}$ | i-th well with choke position cp- gas-lift upper bound |
| $u^t_{i,cp}$ | i-th well with choke position cp on region t- gas-life upper bound |
| U | constraint definition matrix [nc, n] |
| $V_i$ | i-th well value metric |
| V | constraints definition matrix [nc, n] |
| W | constraints definition matrix [nc, l] |
| $x_i$ | i-th well continuous variable gas-lift rate |
| $x^t_{i,cp}$ | auxiliary continuous variable of i-th well with choke position cp on region t |
| x | vector of gas-lift rates [n, l] |
| X | vector of continuous control variables |
| Y | vector of integer control variables |
| $y_{i,cp}$ | binary variable of i-th well indicating choke position cp |
| $y^t_{i,cp}$ | auxiliary binary variable of i-th well with choke position cp on region t |
| $\mathscr{C}$ | set of choke positions {0, 1, . . . , k} |
| $\mathscr{C}_+$ | set of choke positions {1, . . . , k} |
| $\epsilon$ | error norm on wellhead pressure vectors |
| $\epsilon_{tols}$ | error norm tolerance value |
| $\gamma_i$ | i-th well Gas-to-Oil ratio |
| $\omega_i$ | i-th well water-cut |
| $\rho$ | network model specific parameters |

Define a binary variable, $y^t_{i,cp}$, admitting a value of 1 if i is set to choke position cp and the production is given by the smooth curve $g^t_{i,cp}(x_i)$, where t=1,2. The continuous variable, $x^t_{i,cp}$, is similarly defined. Specifically, the aforementioned binary variable and continuous variable are related to the original offline model variables by the following conditions:

$$y_{i,cp} = \sum_{i=1}^{2} y^t_{i,cp}$$

and $$x_i = \sum_{i=1}^{2} \sum_{cp=1}^{k} x^t_{i,cp}.$$

Whenever a binary variable $y^t_{i,cp}$ equals zero, the corresponding continuous variable $x^t_{i,cp}$ will also be equal to zero, giving at most, one nonzero term. Lastly, $l^1_{i,cp}=l_{i,cp}$, $l^2_{i,cp}=m_{i,cp}$, $u^1_{i,cp}=m_{i,cp}$, $u^2_{i,cp}=u_{i,cp}$.

The introduction of the auxiliary variables can alternatively be interpreted as follows. Well i is defined as being composed of 2k sub-wells (indexed as {i,cp,t}) in which each has a smooth production curve defined by $g^t_{i,cp}(x^t_{i,cp})$. Moreover, only a given sub-well is allowed to produce with the following bounds: $l^t_{i,cp} \leq x^t_{i,cp} \leq u^t_{i,cp}$. Therefore, with n wells with k valid choke positions ($\in \mathscr{C}$) the offline model has 2nk continuous variables and 2nk binary variables at most in accordance with one or more embodiments. For example, with smooth-instantaneous (SI) wells only, the offline model will have nk continuous variables and nk binary variables. More than 2 curve regions maybe defined per production well, with t={1,2 ... T} in general case. For example, more than two production curve regions may be defined if the production curve is modeled using piece-wise linear segments.

With the foregoing definitions, the relationship between the production function ($q_i$) and the decision variables may be stated as follows:

$$x_i = \sum_{t=1}^{2} \sum_{cp=1}^{k} x^t_{i,cp} \quad \forall\, i \in I \tag{1}$$

$$q_i = \sum_{t=1}^{2} \sum_{cp=1}^{k} g^t_{i,cp}(x^t_{i,cp}) - g^t_{i,cp}(0)(1 - y^t_{i,cp}) \quad \forall\, i \in I \tag{2}$$

$$l^t_{i,cp} y^t_{i,cp} \leq x^t_{i,cp} \leq u^t_{i,cp} y^t_{i,cp} \quad \forall\, i \in I,\, cp \in \mathscr{C},\, t = 1, 2 \tag{3}$$

$$\sum_{t=1}^{2} \sum_{cp=1}^{k} y^t_{i,cp} \leq 1 \quad \forall\, i \in I \tag{4}$$

In the above formulation, equation (1) relates the auxiliary variables to the original variable for lift gas injection. Equation (4) implies that the choke can be set to at most one non-zero position, and only one curve region can be used to evaluate production. Whenever $y^t_{i,cp}=0$ for some cp and t, then equation (3) implies that $x^t_{i,cp}=0$. If $y^t_{i,cp}=0$ for all i ∈ $\mathscr{C}$, then $x^t_{i,cp}=0$ for all cp and t, and consequently $x_i=0$. If $y^t_{i,cp}=1$ for some cp and t, then $x_i=x^t_{i,cp}$ in equation (1). Also, equation (2) and equation (4) imply that $q_i=q^t_{i,cp}(x^t_{i,cp})$. In addition, equation (3) implies $l^t_{i,cp} \leq x^t_{i,cp} \leq u^t_{i,cp}$, whenever $y^t_{i,cp}=1$, as desired.

Although $q_i$ provides a measure of the total oil production possible from a particular well, $q_i$ may not account for the other components produced, namely, gas, and water. If the provision is available, the produced gas is a saleable quantity that can be appropriately processed and sold. Alternately, produced gas may be treated as a by-product that may be used for gas-lift injection, reservoir pressure support through injector wells or simply disposed of by flaring. Thus, the gas has a process cost and a possible sale value. The produced water may be treated as an undesirable waste product that has a processing and disposal cost. A monetary value can therefore be assigned to each barrel of produced fluid, using the following equation:

$$v_i = p_o(1-\omega_i) - c_w \omega_i + p_g \gamma_i(1-\omega_i) \tag{5}$$

where, $p_o$ is the profit per unit barrel of oil produced, $p_g$ is the profit per unit gas produced (MM-scfd), $c_w$ is the water processing cost per unit barrel, $\gamma$ is the Gas-to-Oil ratio (GOR) and $\omega$ is the water-cut indicating the fraction of water present in the produced fluids. In addition, if $c_g$ is the cost per unit gas injection, the composite objective function may be formulated using the following:

$$\sum_{i=1}^{n} v_i q_i - c_g \sum_{i=1}^{n} x_i \tag{6}$$

where $v_i$ is the unit value of liquid flowing through well i, defined by equation (5). The second term in equation (6) accounts for the cost of lift gas injection in order to prevent excessive lift-gas use. Thus, a production engineer is able to optimize a particular financial objective, by suitably varying the revenue and cost factors, or simply choose to maximize oil production with $v_i=1-\omega_i$ and $c_g=0$.

In addition, operating constraints may exist. Specifically, the operating constraints may include limits imposed at well, manifold (an internal node connecting a number of wells) or at sink (the terminating node comprising production from all wells) level, for capacity and storage limitations on the produced hydrocarbons. For example, maximum liquid, oil, water and gas production constraints may be defined by the following:

$$\sum_{i \in M} q_i \leq q_l^{max} \tag{7}$$

$$\sum_{i \in M} (1-\omega_i) q_i \leq q_o^{max} \tag{8}$$

$$\sum_{i \in M} \omega_i q_i \leq q_w^{max} \tag{9}$$

$$\sum_{i \in M} \gamma_i (1-\omega_i) q_i + \sum_{i \in M} x_i \leq q_g^{max} \tag{10}$$

where M denotes a set of wells (ranging from 1 to n) connected to a particular node of interest. Thus, if q is defined as the vector of the liquid rates and x the vector of lift rates, the operating constraints are defined using matrices U[$n_c$, n], V[$n_c$, n], and W[$n_c$, 1], such that U q+V x≤W, where $n_c$ is the number of constraints applied, n is the number of wells, W is the right-hand side vector, and both U and V contain information about the sub-groupings of concern. Hence, the aforementioned constraint matrices contain the information necessary to specify the operating constraints imposed. However, in one or more embodiments, only the constraints that can be represented offline may be modeled.

The foregoing leads to the full MINLP formulation for the offline problem given by the following:

$$\max \sum_{i=1}^{n} v_i q_i - c_g \sum_{i=1}^{n} x_i \tag{11}$$

$$\text{s.t.,} \sum_{i=1}^{n} x_i \leq C$$

-continued $$x_i = \sum_{i=1}^{2} \sum_{cp=1}^{k} x_{i,cp}^t \qquad \forall\, i \in I$$

$$q_i = \sum_{i=1}^{2} \sum_{cp=1}^{k} g_{i,cp}^t(x_{i,cp}^t) - g_{i,cp}^t(0)(1 - y_{i,cp}^t) \qquad \forall\, i \in I$$

$$l_{i,cp}^t y_{i,cp}^t \le x_{i,cp}^t \le u_{i,cp}^t y_{i,cp}^t \qquad \forall\, i \in I, cp \in C_+,$$
$$t = 1, 2$$

$$\sum_{i=1}^{2} \sum_{cp=1}^{k} y_{i,cp}^t \le 1 \qquad \forall\, i \in I$$

$$Uq + Vx \le W$$

$$y_{i,cp} \in \{0, 1\} \qquad \forall\, i \in I, cp \in C_+,$$
$$t = 1, 2$$

Note that in the above, variables $x_i$ and $q_i$ are shown for clarity, but can be replaced by substitution.

In one or more embodiments, the offline mixed-integer nonlinear formulation is solved using the open source Bomnin (Basic Open-source Nonlinear Mixed INteger programming) solver. In some cases, the offline solution may differ slightly from the online solution at convergence due to the offline curve modeling process. This slight difference may be due to the quality of the performance curves established (i.e., the number of samples and the quantity of curves with varying wellhead pressure) and, to a lesser extent, the quality of the production curves modeled. In addition, network effects imposed by interconnected wells may not be readily captured by the single well analysis used to elicit the performance curves during pre-processing in (232).

As a consequence of the aforementioned issues, especially when operating constraints are present, a solution that may be feasible in the offline model may actually be infeasible in the online model. In such a case, a bootstrapping procedure may be included that updates the properties of the constraints (for example, in the constraint matrix U) by a ratio of mismatches observed between the offline and online (constrained) solution from the most recent iteration for each well. By updating the properties of the constraints in this way, the online solution may match the offline solution more closely and helps ensure that the solution obtained is feasible.

Wells connected to the same manifold may actually have slightly different well-head pressures. The network simulator (i.e., online model) may be configured to tolerate small differences due to the convergence conditions imposed, leading to slightly different values. As this variability may cause the offline-online procedure to take longer to converge, the wellhead pressures of wells connected to common manifolds may be averaged so that, for modeling purposes, all wells have the same wellhead pressure across a given manifold. Further, the modified pressure profile may be denoted by P (of length n), which may be obtained by averaging wellhead pressures over common manifolds. The use of P in the offline model may enhance the stability and convergence rate of the online-offline procedure.

Continuing with FIG. 2, the processor (220) within the production computer system (202) is configured to execute software in accordance with one or more embodiments. Specifically, the processor (220) may be configured to execute the production computer system (202) or any of the engines, models, and repositories described above and shown in FIG. 2, as well as software used by the user (250). The processor (220) may be an integrated circuit, a central processing unit, a multi-core processing chip, a multi-chip module including multiple multi-core processing chips, or other hardware processor. The processor (220) may be known by other names, including but not limited, to a computer processor, a microprocessor, a hardware processor, and a multi-core processor.

In one or more embodiments, the processor (220) is configured to execute software instructions stored in memory (222). The memory (222) may include one or more cache memories, main memory, and/or any other suitable type of memory. The memory (222) may be discretely located on the production computer system (202) relative to the processor (220). In certain configurations, the memory (222) may also be integrated with the processor (220).

Optionally, in one or more embodiments, the security module (228) is configured to secure interactions between the production computer system (202) and the user (250). More specifically, the security module (228) may be configured to authenticate communication from software based on security keys verifying the identity of the source of the communication. For example, user software may be associated with a security key enabling the user software to interact with the production computer system (202). Further, the security module (228) may be configured to restrict requests for information (e.g., a solution), as well as access to information.

Figure 3:
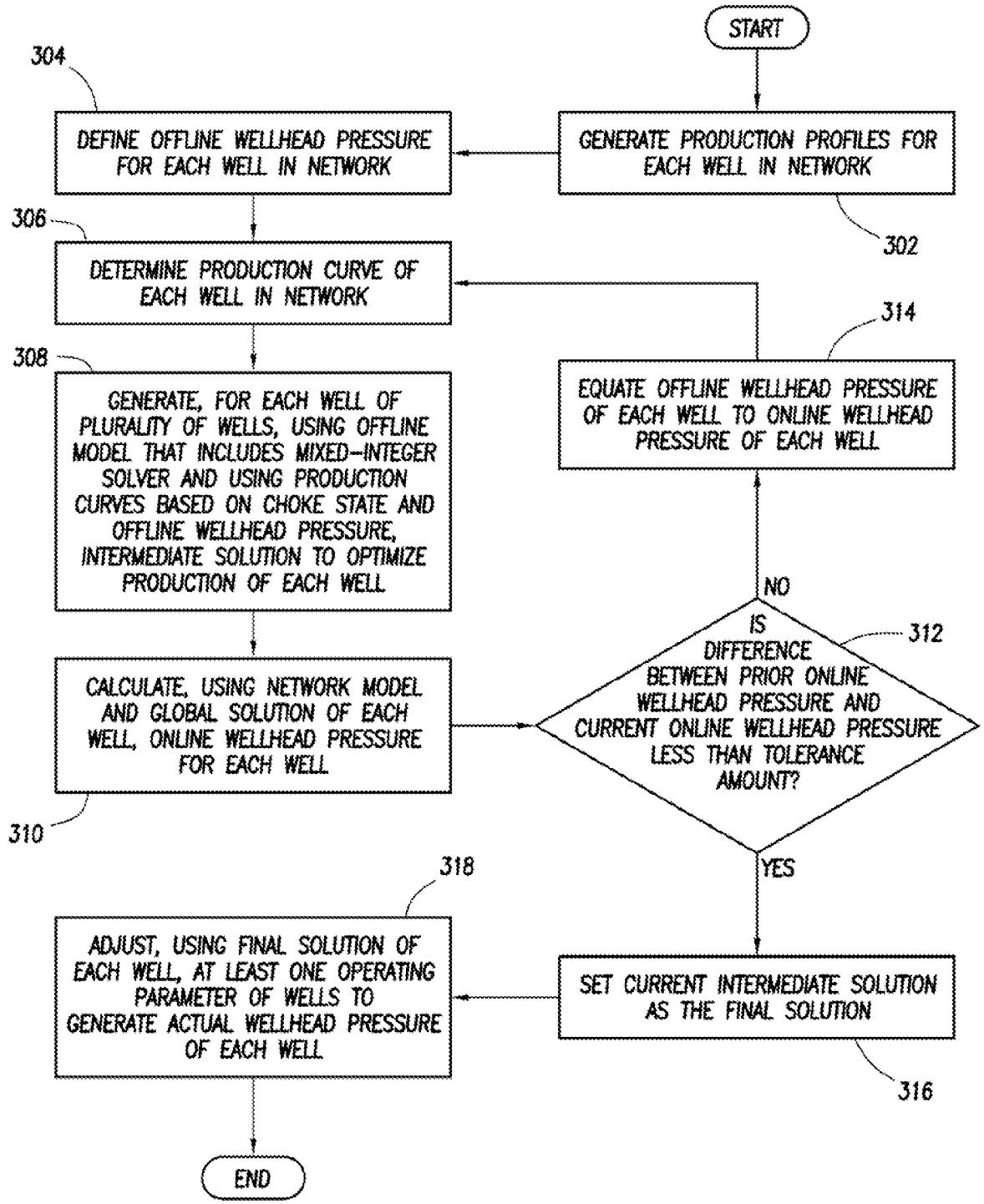
FIG. 3 shows an example method for lift-gas optimization with choke control in accordance with one or more embodiments.

FIG. 3 depicts an example method for lift-gas optimization with choke control in accordance with one or more embodiments. For example, the method depicted in FIG. 3 may be practiced using the surface unit and/or the production computer system described in reference to FIGS. 1 and 2 above. One or more of the elements shown in FIG. 3 may be omitted, repeated, and/or performed in a different order. Accordingly, embodiments of lift-gas optimization with choke control should not be considered limited to the specific arrangements of elements shown in FIG. 3.

In the iterative online-offline process described in this FIG. 3, an element (e.g., an intermediate solution, online wellhead pressure array) that is determined and/or calculated may be an initial element for the first iteration, a final element for the final iteration, and a previous element for each other iteration between the first iteration and the final iteration. In one or more embodiments, a particular computing device, as described, for example, in FIG. 7 below, is used to perform one or more of the elements described below with respect to FIG. 3.

Initially, in 302 of FIG. 3, production profiles are generated for each well in a network of wells. The network of wells may be production wells. The production profiles may be generated in terms of flow rate, an amount of lift gas, some other suitable operating parameter, or any combination thereof. The production profiles may be calculated using the network model and data collected from a number of sensors collecting various data from the oilfield and each wellbore. Examples of data collected by the sensors include, but are not limited to, pressure data, conductivity data, seismic data, log data, and formation characteristic data. In one or more embodiments, once production profiles for is wells are generated, the production profiles may be used, without modification, for each iteration of the method described herein.

In 304 of FIG. 3, an offline wellhead pressure of each well in the network is defined. The offline wellhead pressure may be defined using an initial wellhead pressure array or the wellhead pressure solution from a previous modeling of the network.

In 306 of FIG. 3, a production curve is determined for each well in the network. In one or more embodiments, a production curve for a well is determined using wellhead pressure stipulated in 304 above for an initial iteration of the online-offline process. The production curve for a well may also be determined using the wellhead pressure indicated by (314) below from the previous iteration of the online-offline process. The production curve represents the current operating conditions of the well in the current iteration of the method described herein. The production curve may be selected from among the production profiles for a well in the network generated in a pre-processing step in (302). The production curve may also be generated by interpolation using data from, for example, one or more production curves in the production profile for the well. An example of a production curve, in terms of flow rate and an amount of lift gas, for a well is shown in FIG. 4.

In 308 of FIG. 3, an intermediate solution to optimize production of each well is generated. In one or more embodiments, the intermediate solution for a well is generated for each well in the network. The intermediate solution for each well may be generated using the offline model with a mixed-integer nonlinear program solver. The intermediate solution for a well may also be generated using the production curve for the well (as calculated in 306 above) based on the offline wellhead pressure and the choke state for the well. The intermediate solution for each well may be expressed in terms of gas lift rates (as a continuous decision variable) and/or choke settings (as a discrete decision variable). In the iterative online-offline process, the intermediate solution may be an initial solution for the first iteration, a final solution for the final iteration, and a previous solution for each other iteration between the first and last iterations.

In 310 of FIG. 3, an online wellhead pressure for each well is established. In one or more embodiments, the online wellhead pressure for each well is calculated using a multiphase network simulator using the last intermediate solution given for each well. By using the network model, the online wellhead pressure that is calculated for a well in the network may be dependent upon one or more other wells in the network. The online wellhead pressure for each well may depend on one or more fixed model parameters, including but not limited to network topology, boundary conditions, flow correlations, and fluid compositions.

In 312 of FIG. 3, a determination is made as to whether the difference between a prior online wellhead pressure and a current online wellhead pressure for each well is less than a tolerance amount. In other words, a determination is made as to whether there is convergence of online wellhead pressures for each well. A convergence may be found, for example, if the difference between the online wellhead pressure generate in an immediate prior iteration of 306-314 and the online wellhead pressure generate in the current iteration is less than a tolerance amount. The tolerance amount may vary depending on one or more of a number of factors, including but not limited to network characteristics, production goal, production limitations, cost goal, and cost limitations. If the difference between a prior online wellhead pressure and a current online wellhead pressure is greater than the tolerance amount, then the method proceeds to 314. If the difference between the a prior online wellhead pressure and a current online wellhead pressure is less than the tolerance amount, then the method proceeds to 316.

In 314 of FIG. 3, the offline wellhead pressure of each well is equated to the online wellhead pressure, as calculated in 310 above, of the respective well. When 314 is complete, the method reverts to 306, where another iteration of the method is performed to achieve convergence.

In 316 of FIG. 3, the intermediate solution generated in (308) in the current iteration is set as the final solution. In 318, at least one operating parameter of the network of wells is adjusted, using the final solution of each well, to generate an actual wellhead pressure of each well. Specifically, in one or more embodiments, the final solution of each well identifies a value for each operating parameter that is adjusted. Adjusting a parameter may include changing a state of at least one piece of production equipment at a well to match the value of the operating parameter. The result of the state change may be to change the amount of production of hydrocarbons at the well. Adjusting one or more operating parameters of the network of wells may be based on one or more constraints, including, but not limited to a financial value of the network and a financial cost of the network. When 316 is completed, the method ends.

In algorithmic form, the above-described process may be summarized as:

1: $k=1$

2: $P^k \Leftarrow P^{ini}$

3: $X', Y' \Leftarrow f_{offline}(X, Y, P^k)$

4: $P^{k+1} \Leftarrow f_{online}(X', Y'; \rho)$

5: $\epsilon = \|P^{k+1} - P^k\|_\infty$

6: If: $\epsilon > \epsilon_{tols}$; $P^k \Leftarrow P^{k+1}$; $k \Leftarrow k+1$; Goto step 3.

Else: $\epsilon \leq \epsilon_{tols}$; return $\hat{X}, \hat{Y}, \hat{P}, \hat{F}$; Stop, where $\epsilon$ is the error norm on the wellhead pressure vectors, and P is a vector of wellhead pressures and k is the iteration number.

FIG. 4 shows an example production curve (400) for a well utilizing lift-gas optimization with choke control in accordance with one or more embodiments. The production curve (400) is only one example of a production curve and is not intended to suggest any limitation as to a production curve. Neither should the production curve (400) be interpreted as having any dependency or requirement relating to any one or combination of elements illustrated in the example production curve (400).

FIG. 4 shows a non-smooth and non-instantaneous production curve (400). As described above, because the production curve of FIG. 4 is non-smooth, two different non-linear equations are used to represent the production curve. When the lift gas ($x_i$) (402) is between $l_{i,cp}$ (404) and $m_{i,cp}$ (406), the flow rate (420) for the well may be calculated as $g^1_{i,cp}(x_i)$ (408). When the lift gas ($x_i$) (402) is greater than $m_{i,cp}$, the flow rate (420) for the well may be calculated as $g^2_{i,cp}(x_i)$ (410). The optimal value for the flow rate (420) for the well Occurs when the lift gas (402) equals $u_{i,cp}$ (412). In other words, as described above, injecting too much or too little lift gas (402) into the well leads to a non-optimal flow rate (420).

FIGS. 5.1 through 5.6 depict various graphs and tables that further illustrate the lift-gas optimization with choke control in accordance with one or more embodiments. The example of FIGS. 5.1 through 5.7 uses one or more embodiments to optimize production from a network of 26 wells. In this example, the choke state for each choke is either fully open or fully closed. In other words, a choke state in this example may not be partially open, although one or more embodiments optimize production of a network using a partially open choke state. The solution in this example is based on gas lift rates and well activation state.

FIG. 5.1 shows an oilfield (500) depicted as schematic of a well gathering network (i.e., a network of wells) for the 26 wells. Specifically, wells w1 (501), w2 (502), and w3 (503) are gathered at manifold mA (527). Wells w4 (504) through w13 (513) are gathered at manifold mB (528). Wells w14 (514) through w19 (519) are gathered at manifold mC (529). Wells w20 (520) through w26 (526) are gathered at manifold mD (530). Manifolds mA (527) through mD (530) are gathered at mE (531), from which the produced hydrocarbons are sent to the sink (532).

FIG. 5.2 shows a table having a row for each well (w1 (501) through w26 (526)) with the gas lift injection rate for each iteration by column (initial (540) through 6 (546)) shown in columns. The table of FIG. 5.2 also has rows for the offline objective (i.e., the offline model production output in thousands of stock tank barrels per day) (533) and the online objective (i.e., the online model production output in thousands of stock tank barrels per day) (534), listed for each iteration. The table also lists the time (536) to perform all six iterations as 180.14 seconds. The efficiency and effectiveness of embodiments described herein are discussed below with respect to FIG. 6.

Initially in FIG. 5.2, every well (w1 (501) through w26 (526)) is set to a gas injection rate of 1 million standard cubic feet per day. All choke states are initially open because none of the wells have an initial gas lift injection rate of zero. After the first iteration, the flow rates of all wells (w1 (501) through w26 (526)) are changed. Notably, the flow rate for w3 (503) is reduced to a fraction above zero. At iteration 3 (543), the choke state for w3 (503) changes from open to closed, as the gas lift injection rate for w3 (503) becomes zero.

FIG. 5.3 shows a graph of the objective value of the offline objective (533) compared to the objective value of the online objective (534) by iteration. The gap between the two objective values is widest during the first two iterations. From iterations 3-6, the difference between the two objective values remains relatively the same, although the difference increases a bit when the choke state for w22 (522) changes from open to closed.

The initial gas lift injection rate from iteration 1 (541) and the final gas lift from iteration 6 (546) are shown on a line graph for each well in FIG. 5.4. The graph in FIG. 5.4 confirms (by virtue of zero gas lift injection rate) that the choke state for wells 3 and 22 are fully closed when convergence is reached between the online and offline models.

FIG. 5.5 shows a graphical representation of the initial wellhead pressure (550) and the final wellhead pressure (552) of each well (w1 (501) through w26 (526)). The wellhead pressure is shown in terms of pounds per square inch at atmospheric pressure. The final wellhead pressure (552) for wells 3 and 22 are shown to be zero because the choke state for wells 3 and 22 are fully closed when convergence is reached between the online and offline models.

FIG. 5.6 shows a graphical representation of the initial choke state (562) and the final choke state (560) for each well. As shown in FIG. 5.6, the choke state of all wells, except for wells 3 and 22, are fully open at the first and final iteration.

FIG. 6 shows a table comparing various model test results with lift-gas optimization with choke control in accordance with one or more embodiments. Specifically, in addition to lift-gas optimization with choke control (608) (denoted by GLO*) in accordance with one or more embodiments, the other models compared are GLO (606), which does not include choke control, and polytope and proxy-polytope which are traditionally-used models in the art. The table compares a 2-well case (610), a 4-well case (612), a 26-well case (614), and a 100-well case (616). In all cases, the lift-gas optimization with choke control (608) model, as described herein, takes fewer iterations (simulator calls), and so takes less time and computing resources. The efficiencies of lift-gas optimization with choke control (608) model, as described herein, becomes more pronounced as the number of wells in the network increase. En all cases, the objective function (in terms of stock tank barrels per day) for all models in all cases are substantially similar to each other, which also validates the effectiveness of optimizing production using embodiments of lift-gas optimization with choke control (608).

Figure 7:
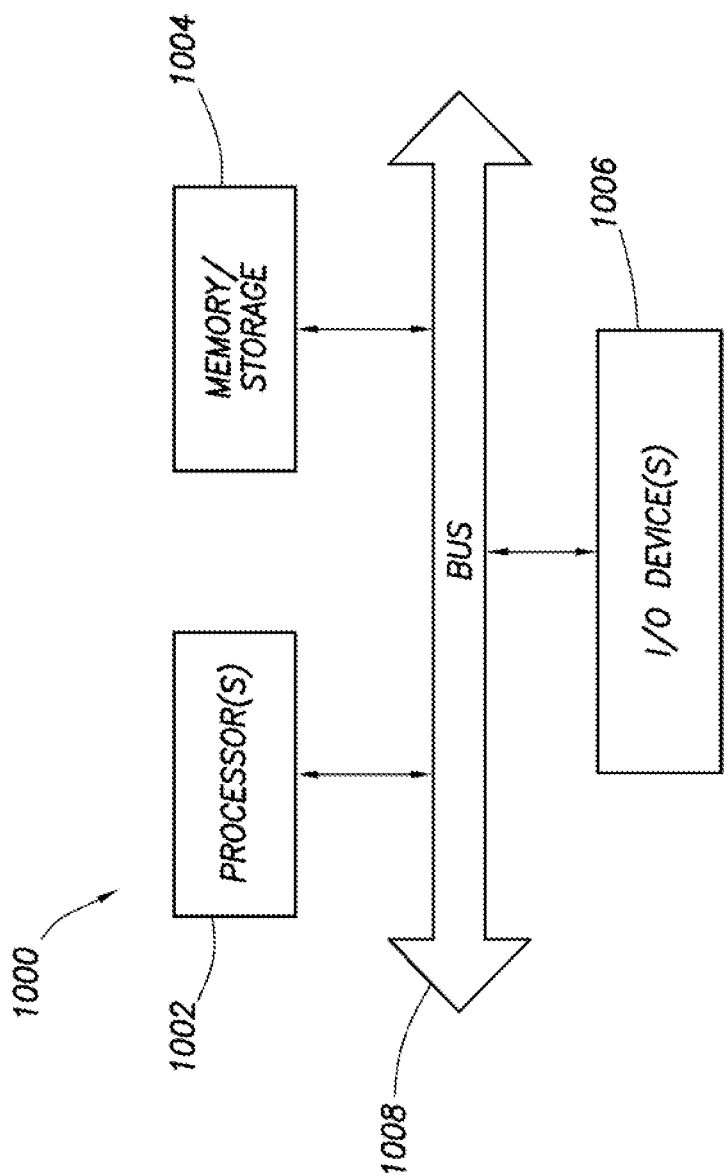
FIG. 7 depicts a computer system in which one or more embodiments of lift-gas optimization with choke control may be implemented.

FIG. 7 depicts one embodiment of a computing device (1000) that can implement the various techniques described herein, and which may be representative, in whole or in part, of the elements described herein. Computing device (1000) is only one example of a computing device and is not intended to suggest any limitation as to scope of use or functionality of the computing device and/or its possible architectures. Neither should computing device (1000) be interpreted as having any dependency or requirement relating to any one or combination of components illustrated in the example computing device (1000).

Computing device (1000) includes one or more processors or processing units (1002), one or more memory and/or storage components (1004), one or more input/output (I/O) devices (1006), and a bus (1008) that allows the various components and devices to communicate with one another. Bus (1008) represents one or more of any of several types of bus structures, including a memory bus or memos controller, a peripheral bus, an accelerated graphics port, and a processor or local bus using any of a variety of bus architectures. Bus (1008) can include wired and/or wireless buses.

Memory/storage component (1004) represents one or more computer storage media. Component (1004) can include volatile media such as random access merrier (RAM)) and/or nonvolatile media (such as read only memory (ROM), flash memory, optical disks, magnetic disks, and so forth). Component (1004) can include fixed media (e.g., RAM, ROM, a fixed hard drive, etc.) as well as removable media (e.g., a Flash memory drive, a removable hard drive, an optical disk, and so forth).

One or more input/output devices (1006) allow a user to enter commands and information to computing device (1000), and also allow information to be presented to the user and/or other components or devices. Examples of input devices include a keyboard, a cursor control device (e.g., a mouse), a microphone, a scanner, and so forth. Examples of output devices include a display device (e.g., a monitor or projector), speakers, a printer, a network card, and so forth.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media can be any available non-transitory medium or non-transitory media that can be accessed by a computing device. By way of example, and not limitation, computer readable media may comprise "computer storage media."

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The computer device (1000) may be connected to a network (not shown) (e.g., a local area network (LAN), a wide area network (WAN) such as the Internet, or any other similar type of network) via a network interface connection (not shown). Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system (1000) includes at least the minimal processing, input, and/or output means necessary to practice one or more embodiments.

Further, those skilled in the art will appreciate that one or more elements of the aforementioned computer device (1000) may be located, at a remote location and connected to the other elements over a network. Further, embodiments may be implemented on a distributed system having a plurality of nodes, where each portion of the implementation (e.g., optimization engine (206), network model (208), offline model (210)) may be located on a different node within the distributed system. In one or more embodiments, the node corresponds to a computer system. Alternatively, the node may correspond to a processor with associated physical memory. The node may alternatively correspond to a processor with shared memory and/or resources.

The systems and methods provided relate to the acquisition of hydrocarbons from an oilfield. It will be appreciated that the same systems and methods may be used for performing subsurface operations, such as mining, water retrieval, and acquisition of other underground fluids or other geomaterials from other fields. Further, portions of the systems and methods may be implemented as software, hardware, firmware, or combinations thereof.

While lift-gas optimization with choke control has been described with respect to a limited number of embodiments, those skilled in the art, having benefit of this disclosure, will appreciate that other embodiments may be devised which do not depart from the scope of lift-gas optimization with choke control as disclosed herein. Accordingly, the scope of lift-gas optimization with choke control should be limited only by the attached claims.

What is claimed is:

1. A method of optimizing production of a plurality of wells using a control mechanism, the method comprising:
generating, for each well of the plurality of wells, an intermediate solution to optimize the production of each well of the plurality of wells using an offline model comprising a mixed-integer nonlinear program solver and using a plurality of production curves based on a state of the control mechanism and a given wellhead pressure;
calculating, using a network model and the intermediate solution of each well of the plurality of wells, a current online wellhead pressure for each well of the plurality of wells, wherein the current online wellhead pressure for each well is dependent upon each other well of the plurality of wells;
setting the intermediate solution as a final solution based on determining that a difference between the current online wellhead pressure of each well and a prior online wellhead pressure of each well of the plurality of wells is less than a tolerance amount; and
adjusting, using the final solution of each well, at least one operating parameter of the plurality of wells to generate an actual wellhead pressure of each well, wherein the final solution of each well identifies a value for the at least one operating parameter.

2. The method of claim 1, further comprising:
determining, using a last online wellhead pressure of each well of the plurality of wells, the plurality of production curves of the plurality of wells.

3. The method of claim 2, further comprising, prior to generating each intermediate solution:
generating, for each well of the plurality of wells, using the mixed-integer nonlinear program solver and the plurality of production curves based on an initial state of the control mechanism, an initial offline solution;
calculating, using the network model and the initial offline solution of each well of the plurality of wells, the prior online wellhead pressure of each well of the plurality of wells;
determining that a difference between the prior online wellhead pressure of each well and an initial wellhead pressure of each well of the plurality of wells is greater than the tolerance amount; and
generating the offline wellhead pressure of each well of the plurality of wells by equating the prior offline wellhead pressure of the each well to the prior online wellhead pressure of the each well,
wherein the plurality of production curves is calculated using the prior online wellhead pressure of each well of the plurality of wells.

4. The method of claim 1, wherein the mixed-integer nonlinear program solver solves a non-linear equation.

5. The method of claim 1, wherein the mixed-integer nonlinear program solver uses a plurality of piece-wise linear equations.

6. The method of claim 1, wherein the plurality of production curves is further based on at least one gas lift injection rate.

7. The method of claim 6, wherein each gas lift injection rate comprises a vector of continuous decision variables.

8. The method of claim 1, wherein each production curve of the plurality of production curves is non-smooth non-instantaneous.

9. The method of claim 1, wherein the state comprises a vector of discrete decision variables.

10. The method of claim 1, wherein each offline wellhead pressure is a component of a vector of a plurality of offline wellhead pressures.

11. The method of claim 1, wherein the plurality of wells comprises a subset of wells connected to a common manifold, wherein each offline wellhead pressure of the subset of wells is an average of a calculated offline wellhead pressure of the subset of wells.

12. The method of claim 1, wherein adjusting the at least one operating parameter of the plurality of wells is based on a financial value of the plurality of wells using the operating parameters and a financial cost of the plurality of wells using the operating parameters.

13. The method of claim 1, wherein the plurality of production curves is further based on at least one electronic submersible pump rate.

14. A system for optimizing production of a plurality of wells using a control mechanism, the system comprising:
a hardware processor;
a plurality of sensors collecting data from the plurality of wells;
an offline model executing on the hardware processor and configured to:
generate, for each well of the plurality of wells, an intermediate solution to optimize the production of each well of the plurality of wells using the data collected by the plurality of sensors, a mixed-integer nonlinear program solver, and a plurality of production curves based on a state of the control mechanism and a given offline wellhead pressure; and a network model operatively connected to the offline model and executing on the hardware processor, wherein the network model is configured to:
calculate, using each intermediate solution of each well of the plurality of wells, a current online wellhead pressure for each well of the plurality of wells, wherein the current online wellhead pressure for each well is dependent upon each other well of the plurality of wells; and an optimization engine operatively connected to the offline model and the network model, wherein the optimization engine executes on the hardware processor and is configured to:
set the intermediate solution as a final solution based on determining that a difference between the current online wellhead pressure of each well and a prior online wellhead pressure of the each well of the plurality of wells is less than a tolerance amount; and
adjust, using the final solution of each well, at least one operating parameter of the plurality of wells to generate an actual wellhead pressure of each well, wherein the final solution of each well identifies a value for the at least one operating parameter.

15. The system of claim 14, wherein the offline model is further configured to:
determine, using a last online wellhead pressure of each well of the plurality of wells, the plurality of production curves of the plurality of wells.

16. The system of claim 15,
wherein the offline model is further configured to generate, for each well of the plurality of wells, using the mixed-integer nonlinear program solver and the plurality of production curves based on an initial state of the control mechanism, an initial offline solution, and
wherein the network model is further configured to:
calculate, using the initial offline solution of each well of the plurality of wells, the prior online wellhead pressure of each well of the plurality of wells,
wherein the optimization engine is further configured to:
determine that a difference between the prior online wellhead pressure of each well and an initial wellhead pressure of each well of the plurality of wells is greater than the tolerance amount; and
generate the offline wellhead pressure of each well of the plurality of wells by equating the initial offline wellhead pressure of the each well to the prior online wellhead pressure of the each well, and
wherein the plurality of production curves is calculated using the prior online wellhead pressure of each well of the plurality of wells.

17. The system of claim 14, wherein the plurality of production curves is further based on at least one electronic submersible pump rate.

18. A non-transitory computer readable medium comprising computer readable program code embodied therein for:
generating, for each well of a plurality of wells, an intermediate solution to optimize the production of each well of the plurality of wells using an offline model comprising a mixed-integer nonlinear program solver and using a plurality of production curves based on a state of a control mechanism and a given wellhead pressure;
calculating, using a network model and the intermediate solution of each well of the plurality of wells, a current online wellhead pressure for each well of the plurality of wells, wherein the current online wellhead pressure for each well is dependent upon each other well of the plurality of wells;
setting the intermediate solution as a final solution based on determining that a difference between the current online wellhead pressure of each well and a prior wellhead pressure of the each well of the plurality of wells is less than a tolerance amount; and
adjusting, using the final solution of each well, at least one operating parameter of the plurality of wells to generate an actual wellhead pressure of each well wherein the final solution of each well identifies a value for at least one operating parameter.

19. The non-transitory computer readable medium of claim 18, further comprising computer readable program code embodied therein for:
determining, using a last online wellhead pressure of each well of the plurality of wells, the plurality of production curves of the plurality of wells.

20. The non-transitory computer readable medium of claim 19, further comprising computer readable program code embodied therein for, prior to generating each global solution:
generating, for each well of the plurality of wells, using the mixed-integer nonlinear program solver and the plurality of production curves based on an initial state of the control mechanism, an initial offline solution;
calculating, using the network model and the initial offline solution of each well of the plurality of wells, the prior online wellhead pressure of each well of the plurality of wells;
determining that a difference between the prior online wellhead pressure of each well and an initial wellhead pressure of the each well of the plurality of wells is greater than the tolerance amount; and
generating the offline wellhead pressure estimate of each well of the plurality of wells by equating the prior offline wellhead pressure of the each well to the prior online wellhead pressure of the each well,
wherein the plurality of production curves is calculated using the prior online wellhead pressure of each well of the plurality of wells.

* * * * *